(12) United States Patent
Kameyama et al.

(10) Patent No.: US 7,795,115 B2
(45) Date of Patent: Sep. 14, 2010

(54) METHOD OF MANUFACTURING SEMICONDUCTOR DEVICE

(75) Inventors: Koujiro Kameyama, Gunma (JP); Akira Suzuki, Gunma (JP); Takahiro Oikawa, Gunma (JP)

(73) Assignees: Sanyo Electric Co., Ltd., Moriguchi-shi (JP); Sanyo Semiconductor Co., Ltd., Gunma (JP); Sanyo Semiconductor Manufacturing Co., Ltd., Ojiya-shi (JP)

( * ) Notice: Subject to any disclaimer, the term of this patent is extended or adjusted under 35 U.S.C. 154(b) by 345 days.

(21) Appl. No.: 11/645,811

(22) Filed: Dec. 27, 2006

(65) Prior Publication Data

US 2007/0166957 A1    Jul. 19, 2007

(30) Foreign Application Priority Data

Dec. 28, 2005  (JP)  ............... 2005-379130
Mar. 7, 2006   (JP)  ............... 2006-061712
Sep. 25, 2006  (JP)  ............... 2006-259288

(51) Int. Cl.
  *H01L 21/00*  (2006.01)
(52) U.S. Cl. ..................... 438/460; 438/667
(58) Field of Classification Search ......... 438/460–464, 438/667
  See application file for complete search history.

(56) References Cited

U.S. PATENT DOCUMENTS

| | | |
|---|---|---|
| 3,648,131 A | 3/1972 | Stuby |
| 3,756,872 A | 9/1973 | Goodman |
| 3,787,252 A | 1/1974 | Filippazzi et al. |
| 4,954,875 A | 9/1990 | Clements |
| 4,978,639 A | 12/1990 | Hua et al. |
| 5,229,647 A | 7/1993 | Gnadinger |
| 5,350,662 A | 9/1994 | Chi |
| 5,476,819 A | 12/1995 | Warren |
| 5,648,684 A | 7/1997 | Bertin et al. |

(Continued)

FOREIGN PATENT DOCUMENTS

DE  19846232  3/2000

(Continued)

OTHER PUBLICATIONS

Badihi, A. (1999) "ShellCase Ultrathin Chip Size Package," Proceedings International Symposium on Advanced Packaging Materials Processes, Properties, and Interfaces: 236-240.

(Continued)

*Primary Examiner*—Richard A. Booth
(74) *Attorney, Agent, or Firm*—Morrison & Foerster LLP

(57) ABSTRACT

The invention is directed to enhancement of reliability and a yield of a semiconductor device by a method of manufacturing the semiconductor device with a supporting body without making the process complex. A second insulation film, a semiconductor substrate, a first insulation film, and a passivation film are etched and removed in this order using a resist layer or a protection layer as a mask. By this etching, an adhesive layer is partially exposed in an opening. At this time, a number of semiconductor devices are separated in individual semiconductor dies. Then, as shown in FIG. 10, a solvent (e.g. alcohol or acetone) is supplied to the exposed adhesive layer through the opening to gradually reduce its adhesion and thereby a supporting body is removed from the semiconductor substrate.

19 Claims, 15 Drawing Sheets

U.S. PATENT DOCUMENTS

| | | |
|---|---|---|
| 5,682,062 A | 10/1997 | Gaul |
| 5,691,245 A | 11/1997 | Bakhit et al. |
| 5,895,234 A | 4/1999 | Taniguchi et al. |
| 5,895,970 A | 4/1999 | Miyoshi |
| 5,904,546 A * | 5/1999 | Wood et al. ................. 438/460 |
| 5,910,687 A | 6/1999 | Chen et al. |
| 5,927,993 A | 7/1999 | Lesk et al. |
| 5,998,866 A | 12/1999 | Ochi et al. |
| 6,002,163 A | 12/1999 | Wojnarowski |
| 6,027,958 A | 2/2000 | Vu et al. |
| 6,040,235 A | 3/2000 | Badehi |
| 6,042,922 A | 3/2000 | Senoo et al. |
| 6,051,489 A | 4/2000 | Young et al. |
| 6,054,760 A | 4/2000 | Martinez-Tovar et al. |
| 6,066,513 A | 5/2000 | Pogge et al. |
| 6,110,825 A | 8/2000 | Mastromatteo et al. |
| 6,136,668 A | 10/2000 | Tamaki et al. |
| 6,184,060 B1 | 2/2001 | Siniaguine |
| 6,214,639 B1 | 4/2001 | Emori et al. |
| 6,221,751 B1 | 4/2001 | Chen et al. |
| 6,259,039 B1 | 7/2001 | Chroneos et al. |
| 6,300,224 B1 | 10/2001 | Arima et al. |
| 6,316,287 B1 | 11/2001 | Zandman et al. |
| 6,326,689 B1 | 12/2001 | Thomas |
| 6,339,251 B2 | 1/2002 | Ha et al. |
| 6,358,772 B2 | 3/2002 | Miyoshi |
| 6,362,529 B1 | 3/2002 | Sumikawa et al. |
| 6,399,463 B1 | 6/2002 | Glenn et al. |
| 6,406,934 B1 | 6/2002 | Glenn et al. |
| 6,420,211 B1 | 7/2002 | Brunet et al. |
| 6,424,031 B1 | 7/2002 | Glenn |
| 6,432,744 B1 | 8/2002 | Amador et al. |
| 6,433,418 B1 | 8/2002 | Fujisawa et al. |
| 6,485,814 B1 | 11/2002 | Moriizumi et al. |
| 6,506,681 B2 | 1/2003 | Grigg et al. |
| 6,552,426 B2 | 4/2003 | Ishio et al. |
| 6,573,157 B1 | 6/2003 | Sato |
| 6,597,059 B1 | 7/2003 | McCann et al. |
| 6,607,941 B2 | 8/2003 | Prabhu et al. |
| 6,611,052 B2 | 8/2003 | Poo et al. |
| 6,624,505 B2 | 9/2003 | Badehi |
| 6,646,289 B1 | 11/2003 | Badehi |
| 6,649,931 B2 | 11/2003 | Honma et al. |
| 6,693,358 B2 | 2/2004 | Yamada et al. |
| 6,703,689 B2 | 3/2004 | Wada |
| 6,720,661 B2 | 4/2004 | Hanaoka et al. |
| 6,753,936 B2 | 6/2004 | Tanaka |
| 6,780,251 B2 | 8/2004 | Tometsuka |
| 6,781,244 B2 | 8/2004 | Prabhu |
| 6,805,279 B2 | 10/2004 | Lee et al. |
| 6,812,573 B2 | 11/2004 | Shimoishizaka et al. |
| 6,828,175 B2 | 12/2004 | Wood et al. |
| 6,848,177 B2 | 2/2005 | Swan et al. |
| 6,864,172 B2 | 3/2005 | Noma et al. |
| 6,894,386 B2 | 5/2005 | Poo et al. |
| 6,964,915 B2 | 11/2005 | Farnworth et al. |
| 7,045,870 B2 | 5/2006 | Wataya |
| 7,064,047 B2 | 6/2006 | Fukasawa et al. |
| 7,067,354 B2 | 6/2006 | Prabhu |
| 7,101,735 B2 | 9/2006 | Noma et al. |
| 7,112,881 B2 | 9/2006 | Kaida et al. |
| 7,157,742 B2 | 1/2007 | Badehi |
| 7,205,635 B1 | 4/2007 | MacIntyre |
| 7,208,340 B2 | 4/2007 | Noma |
| 7,271,466 B2 | 9/2007 | Noma et al. |
| 7,312,107 B2 | 12/2007 | Noma et al. |
| 7,312,521 B2 | 12/2007 | Noma et al. |
| 7,456,083 B2 | 11/2008 | Noma et al. |
| 2001/0005043 A1 | 6/2001 | Nakanishi et al. |
| 2002/0005400 A1 | 1/2002 | Gat |
| 2002/0016024 A1 | 2/2002 | Thomas |
| 2002/0022343 A1 | 2/2002 | Nonaka |
| 2002/0025587 A1 | 2/2002 | Wada |
| 2002/0038890 A1 | 4/2002 | Ohuchi |
| 2002/0047210 A1 | 4/2002 | Yamada et al. |
| 2002/0048889 A1 | 4/2002 | Hayama et al. |
| 2002/0076855 A1 | 6/2002 | Pierce |
| 2002/0089043 A1 | 7/2002 | Park et al. |
| 2002/0105591 A1 | 8/2002 | Nakamura et al. |
| 2002/0110953 A1 | 8/2002 | Ahn et al. |
| 2002/0139577 A1 | 10/2002 | Miller |
| 2002/0158060 A1 | 10/2002 | Uchiyama et al. |
| 2002/0185725 A1 | 12/2002 | Moden et al. |
| 2003/0077878 A1 | 4/2003 | Kumar et al. |
| 2003/0094683 A1 | 5/2003 | Poo et al. |
| 2003/0134453 A1 | 7/2003 | Prabhu et al. |
| 2003/0216009 A1 | 11/2003 | Matsuura et al. |
| 2003/0230805 A1 | 12/2003 | Noma et al. |
| 2004/0017012 A1 | 1/2004 | Yamada et al. |
| 2004/0041260 A1 | 3/2004 | Wood et al. |
| 2004/0137701 A1 | 7/2004 | Takao |
| 2004/0142509 A1 | 7/2004 | Imai |
| 2004/0161920 A1 | 8/2004 | Noma |
| 2004/0229405 A1 | 11/2004 | Prabhu |
| 2004/0235270 A1 | 11/2004 | Noma et al. |
| 2004/0238926 A1 | 12/2004 | Obinata |
| 2005/0009313 A1 | 1/2005 | Suzuki et al. |
| 2005/0095750 A1 | 5/2005 | Lo et al. |
| 2005/0176235 A1 | 8/2005 | Noma et al. |
| 2005/0208735 A1 | 9/2005 | Noma et al. |
| 2005/0221585 A1 | 10/2005 | Perregaux et al. |
| 2005/0266660 A1 | 12/2005 | Behammer |
| 2006/0068572 A1 | 3/2006 | Noma et al. |
| 2006/0079019 A1 | 4/2006 | Kim |
| 2006/0141750 A1 | 6/2006 | Suzuki et al. |
| 2006/0270093 A1 | 11/2006 | Noma et al. |
| 2007/0026639 A1 | 2/2007 | Noma et al. |
| 2007/0117352 A1 | 5/2007 | Lee et al. |
| 2007/0138498 A1 | 6/2007 | Zilber et al. |
| 2008/0093708 A1 | 4/2008 | Noma et al. |
| 2008/0265424 A1 | 10/2008 | Noma et al. |
| 2009/0023249 A1 | 1/2009 | Honer et al. |

FOREIGN PATENT DOCUMENTS

| | | |
|---|---|---|
| DE | 10238444 | 3/2004 |
| EP | 0468874 | 1/1992 |
| EP | 1041617 | 10/2000 |
| EP | 1 085 570 | 3/2001 |
| EP | 376678 | 1/2004 |
| EP | 1429377 | 6/2004 |
| FR | 2 767 223 | 2/1999 |
| JP | 6-2101678 | 5/1987 |
| JP | 62-094925 | 5/1987 |
| JP | 3-152942 | 6/1991 |
| JP | 3-286553 | 12/1991 |
| JP | 5-287082 | 11/1993 |
| JP | 7-58132 | 3/1995 |
| JP | 09-46566 | 2/1997 |
| JP | 09-063993 | 3/1997 |
| JP | 10-242084 | 9/1998 |
| JP | 11-163193 | 6/1999 |
| JP | 11-307624 | 11/1999 |
| JP | 2000-77478 | 3/2000 |
| JP | 2000-173952 | 6/2000 |
| JP | 2000-183025 | 6/2000 |
| JP | 2000-195987 | 7/2000 |
| JP | 2000-286283 A | 10/2000 |
| JP | 2001-068618 | 3/2001 |
| JP | 2001-77229 | 3/2001 |
| JP | 2001-127243 A | 5/2001 |
| JP | 2001-185519 | 7/2001 |
| JP | 2001-189414 A | 7/2001 |
| JP | 2001-210667 | 8/2001 |

| | | |
|---|---|---|
| JP | 2002-083785 | 3/2002 |
| JP | 2002-093942 | 3/2002 |
| JP | 2002-94082 A | 3/2002 |
| JP | 2002-512436 A1 | 4/2002 |
| JP | 2002-231918 | 8/2002 |
| JP | 2002-270676 | 9/2002 |
| JP | 2002-329849 | 11/2002 |
| JP | 2003-7898 | 1/2003 |
| JP | 2003-116066 | 4/2003 |
| JP | 2005-191550 | 7/2005 |
| KR | 10-0410812 | 12/2003 |
| WO | WO-99/36958 | 7/1999 |
| WO | WO-99/40624 | 8/1999 |
| WO | WO 02/50875 | 6/2002 |
| WO | WO 02/51217 | 6/2002 |

OTHER PUBLICATIONS

Luxbacher, T., Ph.D., et al. (Jul. 1999) Spray Coating for MEMS Interconnect & Advanced Packaging Applications: Fujifilm Interface; The 42$^{nd}$ Interface Microlithography Symposium; 5 pages.

Noma, Takashi et al., U.S Office Action mailed Feb. 26, 2009, directed at U.S Appl. No. 12/133,171; 7 pages.

Noma, Takashi et al., U.S Office Action mailed Jul. 11, 2008, directed at U.S Appl. No. 90/008,219; 17 pages.

Noma, Takashi et al., U.S Office Action mailed Apr. 28, 2009, directed at U.S Appl. No. 11/488,890;8 pages.

Noma, Takashi et al., U.S Office Action mailed Mar. 28, 2005, directed at U.S Appl. No.. 10/696,581; 10 pages.

Noma, Takashi et al., U.S Office Action mailed Apr. 16, 2008, directed at U.S Appl. No. 10/876,532; 7 pages.

Noma, Takashi et al., U.S. Office Action mailed Jul. 27, 2005, directed at U.S. Appl. No. 10/876,532; 6 pages.

Noma, Takashi et al., U.S. Office Action mailed Mar. 15, 2006, directed at U.S. Appl. No. 10/876,532; 9 pages.

Noma, Takashi et al., U.S. Office Action mailed Sep. 5, 2006, directed at U.S. Appl. No. 10/876,532; 7 pages.

Noma, Takashi et al., U.S. Office Action mailed Mar. 5, 2007, directed at U.S. Appl. No. 10/876,532; 7 pages.

Noma, Takashi et al., U.S. Office Action mailed Nov. 14, 2008, directed at U.S. Appl. No. 10/876,532; 9 pages.

Noma, Takashi et al., U.S. Office Action mailed May 26, 2009, directed at U.S. Appl. No. 10/876,532; 11 pages.

Noma, Takashi et al., U.S. Office Action mailed Nov. 20, 2006, directed at U.S. Appl. No. 11/206,146; 9 pages.

Noma, Takashi et al., U.S. Office Action mailed on May 1, 2007, directed at U.S. Appl. No. 11/206,146; 5 pages.

Noma, Takashi et al., U.S. Office Action mailed Apr. 16, 2009, directed at U.S. Appl. No. 11/956,160;24 pages.

Noma, Takashi et al., U.S. Office Action mailed Oct. 16, 2008, directed at U.S. Appl. No. 11/956,160; 31pages.

Noma, Takashi et al., U.S. Office Action mailed Dec. 9, 2004, directed at U.S. Appl. No. 10/420,943; 8 pages.

Noma, Takashi et al., U.S. Office Action mailed Aug. 1, 2006, directed at U.S. Appl. No. 10/420,943; 8 pages.

Noma, Takashi et al., U.S. Office Action mailed Feb. 2, 2007, directed at U.S. Appl. No. 10/420,943; 9 pages.

Noma, Takashi et al., U.S. Office Action mailed Aug. 27, 2007, directed at U.S. Appl. No. 11/035,399; 7 pages.

Noma, Takashi et al., U.S. Office Action mailed Mar. 7, 2007, directed at U.S. Appl. No. 11/035,399; 6 pages.

Noma, Takashi et al., U.S. Office Action mailed Apr. 12, 2007, directed at U.S. Appl. No. 10/910,805; 7 pages.

Noma, Takashi et al., U.S. Office Action mailed Oct. 11, 2006, directed at U.S. Appl. No. 10/910,805; 8 pages.

Noma, Takashi et al., U.S. Office Action mailed Apr. 2, 2004, directed at U.S. Appl. No. 10/462,829; 8 pages.

Noma, Takashi et al., U.S. Office Action mailed Jul. 21, 2006, directed at U.S. Appl. No. 10/733,799; 7 pages.

Noma, Takashi et al., U.S. Office Action mailed Nov. 8, 2005, directed at U.S. Appl. No. 10/733,799; 5 pages.

Noma, Takashi et al., U.S. Office Action mailed Jun. 9, 2005, directed at U.S. Appl. No. 10/733,799; 7 pages.

European Search Report, dated Apr. 3, 2009 directed to related application No. EP 04 01 8715; 3 pages.

European Search Report, dated Sep. 12, 2003, directed to EP-03010938; (4 pages).

European Office Action, dated Sep. 20, 2004, directed to EP Application No. 03013839.0; (5 pages).

European Office Action, dated Aug. 10, 2005, directed to EP Application No. 030109388.3; (15 pages).

European Office Action, dated Sep. 26, 2005, directed to EP Application No. 03013839.0; (3 pages).

European Office Action, dated Apr. 10, 2006, directed to EP Application No. 0301938.3; (4 pages).

European Search Report, dated Jul. 21, 2009, directed to EP Application No. 06026978.4; (4 pages).

Noma et al., U.S. Office Action mailed Aug. 12, 2009, directed to U.S. Appl. No. 11/956,160; (13 pages).

Noma, T. et al., U.S. Office Action mailed Oct. 27, 2009, directed to U.S. Appl. No. 12/133,171; 6 pages.

Extended EP Search Report dated Sep. 24, 2009, directed to EP Patent Application No. 06026978.4; 15 pages.

Noma, Takashi et al., U.S. Office Action mailed Jan. 19, 2010, directed to U.S. Appl. No. 11/956,160; 11 pages.

* cited by examiner

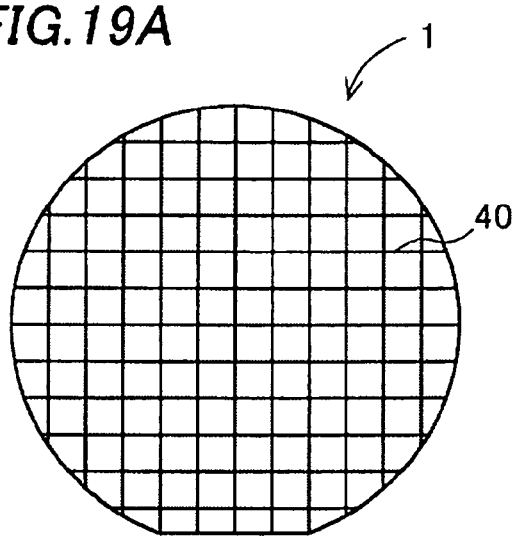
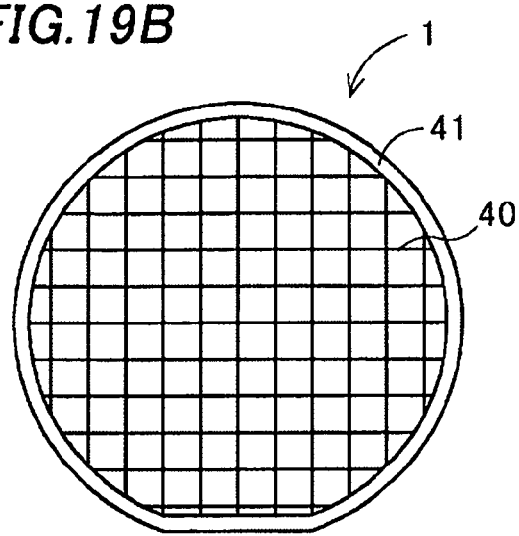
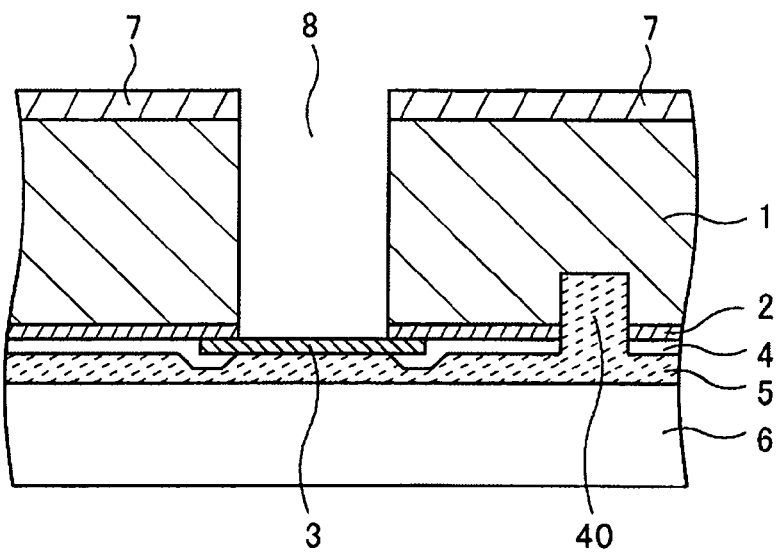

METHOD OF MANUFACTURING SEMICONDUCTOR DEVICE

CROSS-REFERENCE OF THE INVENTION

This application claims priority from Japanese Patent Application Nos. 2005-379130, 2006-061712, and 2006-259288, the contents of which are incorporated herein by reference in their entirety.

BACKGROUND OF THE INVENTION

1. Field of the Invention

The invention relates to a method of manufacturing a semiconductor device, particularly, a method of manufacturing a semiconductor device with a supporting body.

2. Description of the Related Art

In recent years, thinner and smaller semiconductor dies have been required for increasing the packaging density. For satisfying this, it is necessary to thin a semiconductor substrate made of silicon or the like. However, the thin substrate can not be moved in a manufacturing process since it warps or breaks due to its low strength. Therefore, generally, a supporting body such as a glass substrate or a protection tape is attached on one surface of the semiconductor substrate, and the other surface where the supporting body is not attached is thinned by grinding it with a grinder or the like.

FIGS. 15 and 16 are schematic cross-sectional views showing a process of removing a supporting body in a conventional method of manufacturing a semiconductor device. As shown in FIG. 15, a pad electrode 101 made of aluminum or the like is formed on a front surface of a semiconductor substrate 100 made of silicon or the like with a first insulation film 102 such as a silicon oxide film interposed therebetween. A passivation film 103 such as a silicon nitride film covers a portion of the pad electrode 101. A glass substrate 104 as a supporting body is further attached on the front surface of the semiconductor substrate 100 with an adhesive layer 105 interposed therebetween. A plurality of penetrating holes 106 for supplying a solvent for the adhesive layer 105 is formed in the glass substrate 104. A film-type protection tape may be used as the supporting body instead of the glass substrate 104 or a rigid substrate made of metal, resin, or the like.

A via hole 107 is formed penetrating the semiconductor substrate 100 from its back surface to the pad electrode 101. A second insulation film 108 such as a silicon oxide film is formed on a sidewall of this via hole 107 and the back surface of the semiconductor substrate 100.

Furthermore, a barrier layer 109 and a penetrating electrode 110 electrically connected to the pad electrode 101 are formed in the via hole 107, and a wiring layer 111 connecting with the penetrating electrode 110 is extended on the back surface of the semiconductor substrate 100. A protection layer 112 made of a solder resist or the like is formed covering the second insulation film 108, the wiring layer 111, and the penetrating electrode 110, an opening is formed in a predetermined region of the protection layer 112, and a ball-shaped conductive terminal 113 is formed in this opening.

Then, as shown in FIG. 16, a dicing tape 115 is attached on the back surface of the semiconductor substrate 100, and a solvent (e.g. alcohol or acetone) for the adhesive layer 105 is supplied from the penetrating holes 106 to remove the glass substrate 104. Then, the semiconductor substrate is cut along a dicing line DL with a dicing blade or a laser and individual semiconductor dies are separated from each other.

When the film-type protection tape is used instead of the glass substrate 104, the protection tape (supporting body) is removed after the dicing, by, for example, peeling it with an adhesive tape (see FIG. 7 etc. in the Japanese Patent Application Publication No. 2002-270676).

The relevant technologies are disclosed in Japanese Patent Application Publication Nos. 2005-191550, 2002-270676, and 2001-185519.

However, in the conventional method of manufacturing the semiconductor device described above, since the fine penetrating holes 106 or grooves as paths for supplying the solvent for the adhesive layer 105 are formed in the glass substrate 104 as the supporting body, there is a problem that the manufacturing process is complex and the cost is high. Using such a supporting body formed with the solvent supply paths also causes undesired influence on the process of manufacturing the semiconductor device, such as outgassing or infiltration of a corrosive substance at the paths. Furthermore, the strength of the supporting body lowers by forming the solvent supply paths, and the supporting body may suffer mechanical damage.

Furthermore, it is difficult to check the metal contamination state of the solvent supply paths such as the penetrating holes 106 or the grooves for recycling the supporting body.

Although the film-type protection tape may be used as the supporting body instead of the rigid supporting body made of glass, quartz, ceramic, metal, resin, or the like formed with the solvent supply paths such as the penetrating holes 106 or the grooves, the conventional method of removing the protection tape has a problem of causing a mechanical defect in the thinned semiconductor device when the protection tape is removed. Using the protection tape as the supporting body also causes a problem that the thermal resistance of the protection tape needs to be taken into account in the manufacturing process.

Therefore, the invention is directed to simplification of the process of manufacturing the semiconductor device with the supporting body, reduction of the manufacturing cost, and enhancement of the reliability and yield of the semiconductor device. The invention is also directed to realization of the method of manufacturing the semiconductor device suitable for thinning and miniaturizing the semiconductor device.

SUMMARY OF THE INVENTION

The features of the invention are as follows. The invention provides a method of manufacturing a semiconductor device including: preparing a semiconductor substrate formed with a pad electrode on its front surface; attaching a supporting body on the front surface of the semiconductor substrate with an adhesive layer interposed therebetween; forming a via hole in the semiconductor substrate; forming a penetrating electrode electrically connected to the pad electrode in the via hole; forming a protection layer covering a back surface of the semiconductor substrate including the penetrating electrode; removing a portion of the semiconductor substrate to expose a portion of the adhesive layer; and separating the supporting body from the semiconductor substrate by supplying a solvent dissolving the adhesive layer from a portion exposing the adhesive layer.

The method of the invention further includes forming an electrode connection layer for connection to an electrode of an other semiconductor device on the pad electrode before attaching the supporting body.

In the method of the invention, a path for supplying the solvent is not formed in the supporting body.

The invention also provides a method of manufacturing a semiconductor device including: attaching a supporting body on a front surface of a semiconductor substrate with an adhesive layer interposed therebetween; removing a portion of the semiconductor substrate to form an opening exposing the adhesive layer from a back surface of the semiconductor substrate; and separating the supporting body from the semiconductor substrate by supplying a solvent dissolving the adhesive layer from a portion exposing the adhesive layer.

The invention also provides a method of manufacturing a semiconductor device including: preparing a semiconductor substrate formed with a pad electrode with an insulation film interposed therebetween; attaching a supporting body on a front surface of the semiconductor substrate with an adhesive layer interposed therebetween; exposing the pad electrode by removing the semiconductor substrate and the insulation film; forming a wiring layer electrically connected to the exposed pad electrode; forming a protection film covering a back surface of the semiconductor substrate including the wiring layer; removing a portion of the semiconductor substrate to expose a portion of the adhesive layer; and separating the supporting body from the semiconductor substrate by supplying a solvent dissolving the adhesive layer from a portion exposing the adhesive layer.

BRIEF DESCRIPTION OF THE DRAWINGS

FIGS. 17 to 18C and 20 to 25 are cross-sectional views for explaining a method of manufacturing a semiconductor device of a third embodiment of the invention.

FIGS. 19A and 19B are plan views for explaining the method of manufacturing the semiconductor device of the third embodiment of the invention.

DETAILED DESCRIPTION OF THE INVENTION

A first embodiment of the invention will be described referring to figures. FIGS. 1 to 10 are cross-sectional views of device intermediates during the manufacturing process of the first embodiment, shown in manufacturing order.

Figure 1:
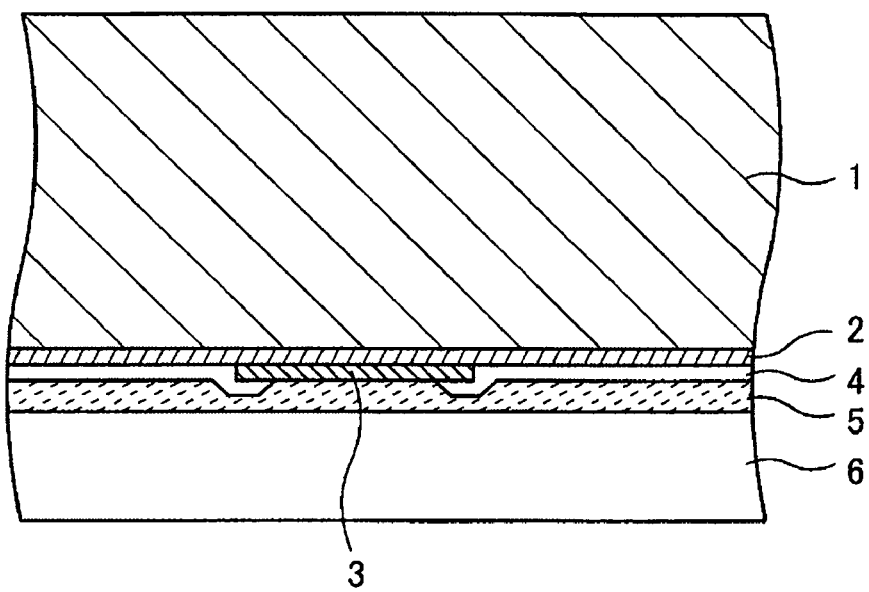
FIGS. 1 to 11 and 14 are cross-sectional views for explaining a method of manufacturing a semiconductor device of a first embodiment of the invention.

First, as shown in FIG. 1, a semiconductor substrate 1 formed with an electronic device (e.g. a light receiving element such as CCD or an infrared ray sensor or a light emissive element) (not shown) on its front surface is prepared. The semiconductor substrate 1 is about 300 to 700 μm in thickness, for example. Then, a first insulation film 2 (e.g. a silicon oxide film or a BPSG film formed by a thermal oxidation method or a CVD method) is formed on the front surface of the semiconductor substrate 1 to have a thickness of, for example, 2 μm.

Then, a metal layer made of aluminum (Al), copper (Cu), or the like is formed by a sputtering method, a plating method, or the other deposition method, and then the metal layer is etched using a resist layer (not shown) as a mask to form a pad electrode 3 having a thickness of, for example, 1 μm on the first insulation film 2. The pad electrode 3 is electrically connected to the electronic device or the surrounding elements on the semiconductor substrate 1.

Then, a passivation film 4 (e.g. a silicon nitride film formed by a CVD method) is formed on the front surface of the semiconductor substrate 1, covering a portion of the pad electrode 3. The first insulation film 2 and the passivation film 4 may not be formed on boundaries of individual semiconductor dies or may be formed on the boundaries for using these films as stopper layers as described below.

Then, a supporting body 6 is attached on the front surface of the semiconductor substrate 1 including on the pad electrode 3 with an adhesive layer 5 made of epoxy resin, a resist, acrylic, or the like interposed therebetween. A film-type protection tape may be used as the supporting body 6, for example, but a rigid substrate made of glass, quartz, ceramic, plastic, metal, resin, or the like is preferable for firmly supporting the thinned semiconductor substrate 1 and automating the movement of the substrate 1 without a manual control. It is not necessary to form a path (a penetrating hole or a groove) for supplying a solvent for the adhesive layer 5 in the supporting body 6. The supporting body 6 has a function of supporting the semiconductor substrate 1 and protecting the front surface thereof.

Then, back-grinding is performed to a back surface of the semiconductor substrate 1 with a back surface grinder to thin the semiconductor substrate 1 to a predetermined thickness (e.g. about 50 to 20 μm). This grinding process may be performed by etching or both with the grinder and by etching. There is also a case where the grinding process is not necessary depending on applications or specifications of an end-product and the initial thickness of the prepared semiconductor substrate 1.

Figure 2:
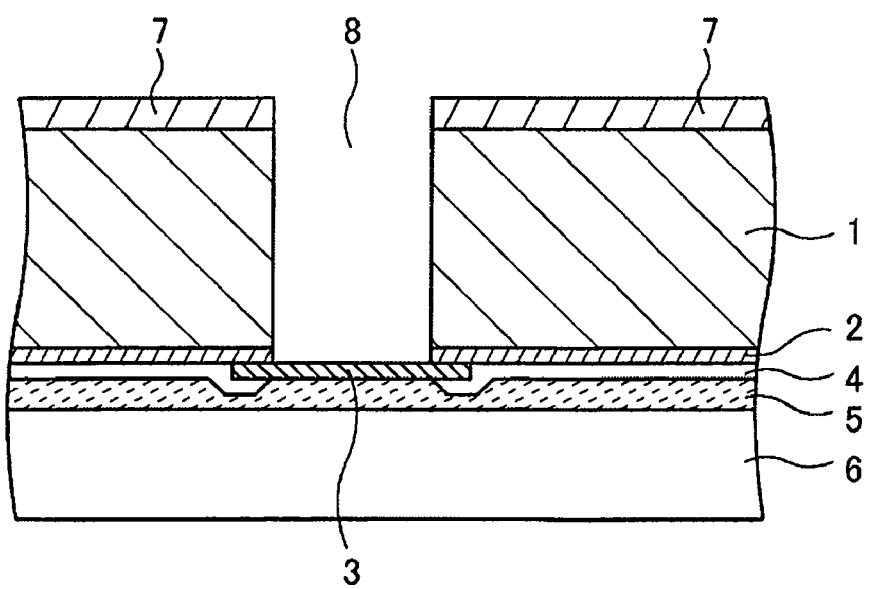

Then, as shown in FIG. 2, a resist layer 7 is selectively formed on the back surface of the semiconductor substrate 1. The resist layer 7 has an opening in a position corresponding to the pad electrode 3 on the back surface of the semiconductor substrate 1. Then, the semiconductor substrate 1 is etched using this resist layer 7 as a mask. By this etching, a via hole 8 is formed penetrating the semiconductor substrate 1 from its back surface to its front surface in a position corresponding to the pad electrode 3. The first insulation film 2 is exposed at a bottom of the via hole 8. Then, etching is further performed using the resist layer 7 as a mask to remove the exposed first insulation film 2. This process of etching the first insulation film 2 may not be performed at this time, and may be performed in the other etching process simultaneously.

Although not shown, the via hole 8 may not penetrate the semiconductor substrate 1 from its back surface to its front surface, and the bottom of the via hole 8 may be formed in the semiconductor substrate 1 instead.

Figure 3:
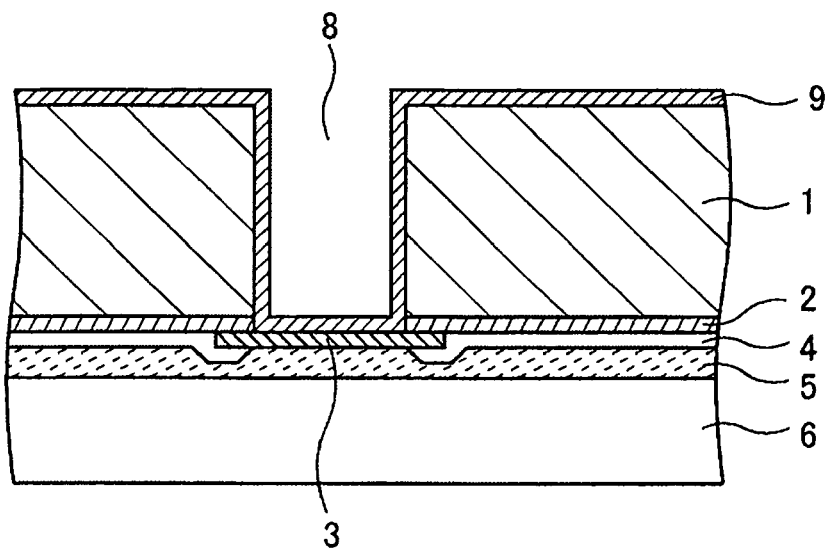

Then, the resist layer 7 is removed, and a second insulation film 9 (e.g. a silicon oxide film or a silicon nitride film formed by a CVD method) is formed on the whole back surface of the semiconductor substrate 1 including in the via hole 8 as shown in FIG. 3.

Figure 4:
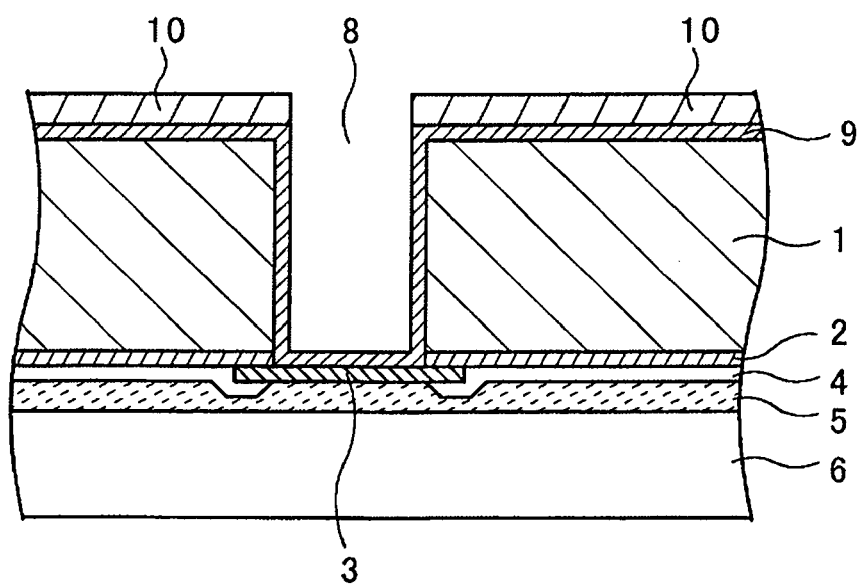
Figure 5:
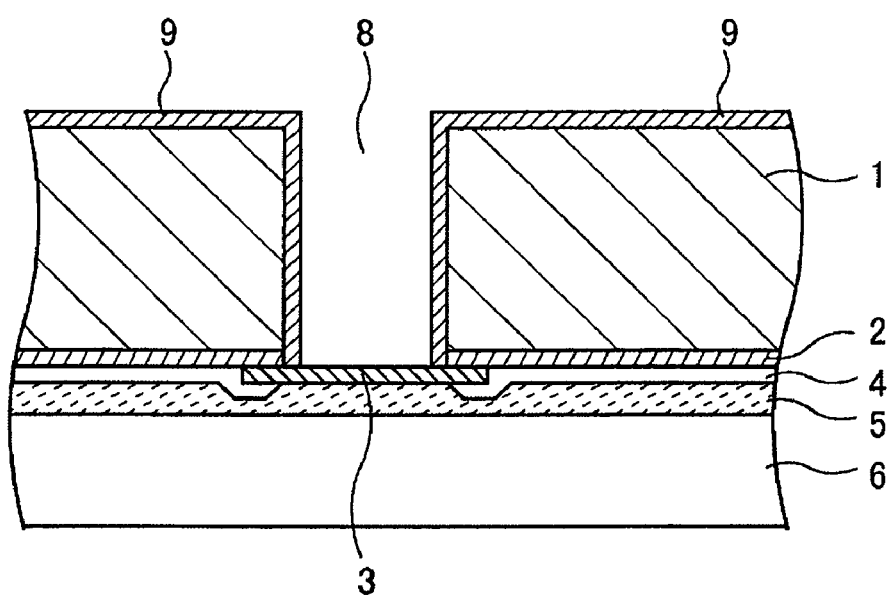

Then, as shown in FIG. 4, a resist layer 10 is formed on the second insulation film 9. Then, as shown in FIG. 5, the second insulation film 9 at the bottom of the via hole 8 is removed by etching using the resist layer 10 as a mask. This etching may be performed without the mask by utilizing the tendency that the second insulation film 9 is formed thicker on the back surface of the semiconductor substrate 1 and thinning toward the sidewall and the bottom of the via hole 8. Etching without the mask streamlines the manufacturing process.

Figure 6:
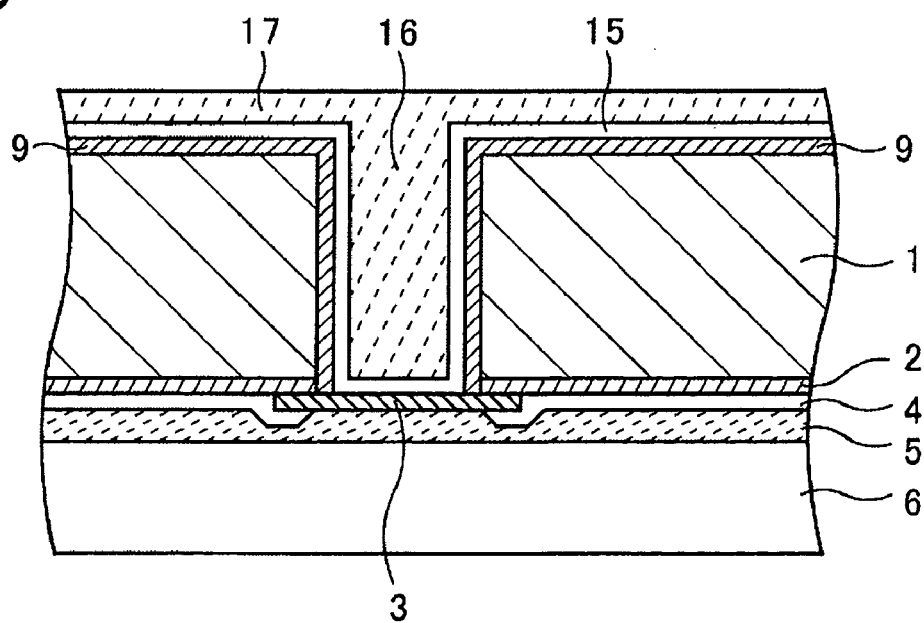

Then, as shown in FIG. 6, a barrier layer 15 is formed on the second insulation film 9 on the back surface of the semiconductor substrate 1 including in the via hole 8. A seed layer (not shown) is further formed on the barrier layer 15. The barrier layer 15 is made of, for example, a titanium (Ti) layer, a titanium nitride (TiN) layer, a tantalum nitride (TaN) layer, or the like. The seed layer is to be an electrode for forming a penetrating electrode 16 and a wiring layer 17 by a plating method that will be described below and made of, for example, metal such as copper (Cu). These layers are formed by a sputtering method, a plating method, or the other deposition method.

Then, a penetrating electrode 16 and the wiring layer 17 connecting with the electrode 16, that are made of copper (Cu), are formed on the barrier layer 15 and the seed layer (not shown) including in the via hole 8 by, for example, an electrolytic plating method. The penetrating electrode 16 and the wiring layer 17 are electrically connected to the pad electrode 3 exposed at the bottom of the via hole 8 through the barrier layer 15 and the seed layer (not shown).

Figure 14:
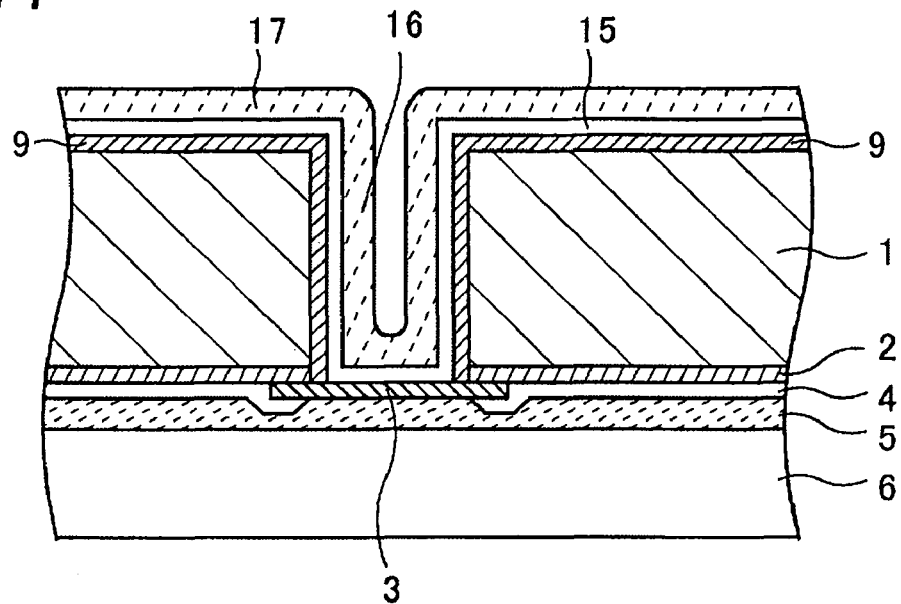
Figure 15:
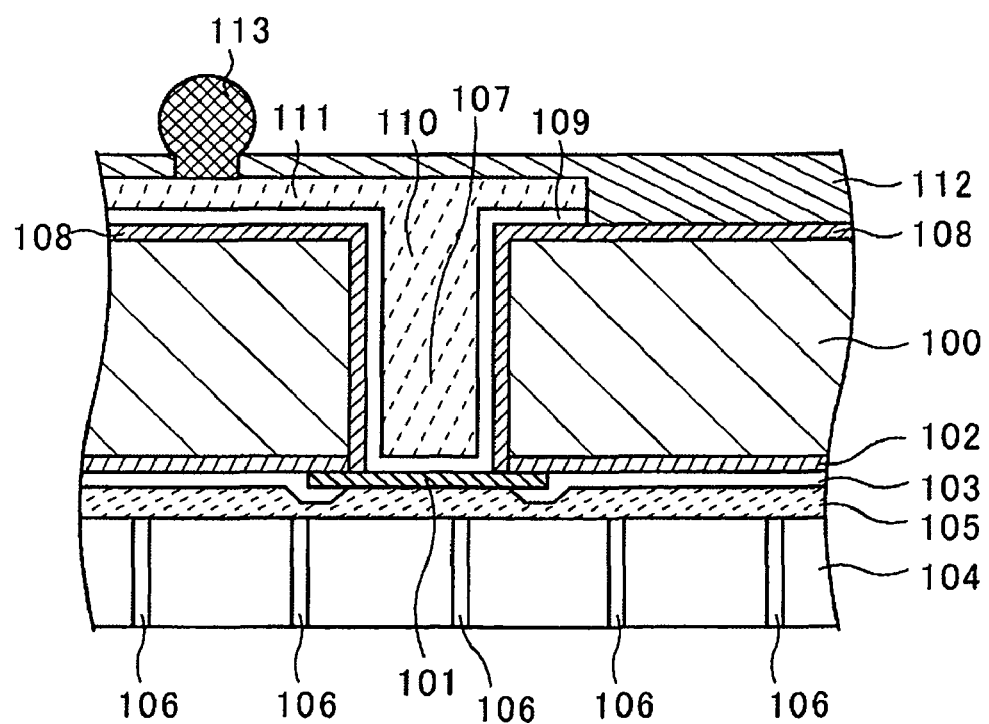
FIGS. 15 and 16 are cross-sectional views for explaining a conventional method of manufacturing a semiconductor device.
Figure 16:
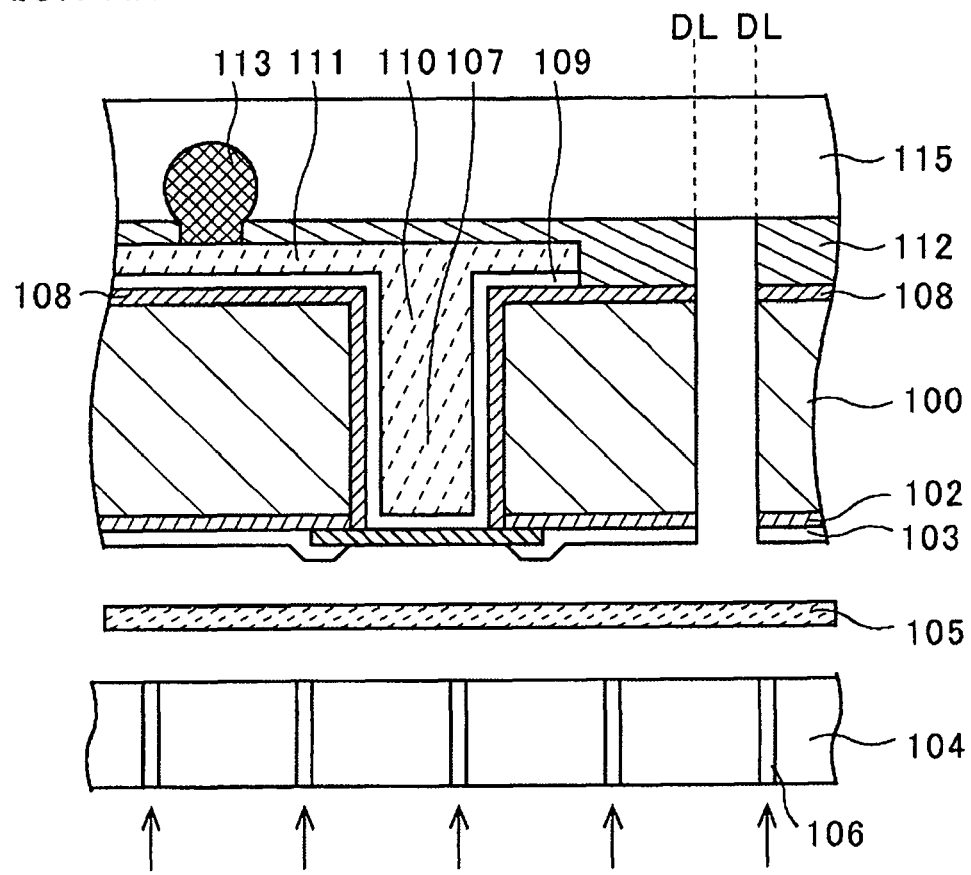

The via hole 8 may not be filled with the penetrating electrode 16 completely but partially as shown in FIG. 14. Compared with the case where the hole 8 is filled completely, this structure saves a conductive material necessary for forming the penetrating electrode 16 and the wiring layer 17 and shortens the time for forming the penetrating electrode 16 and the wiring layer 17, thereby having an advantage of increasing a throughput.

Figure 7:
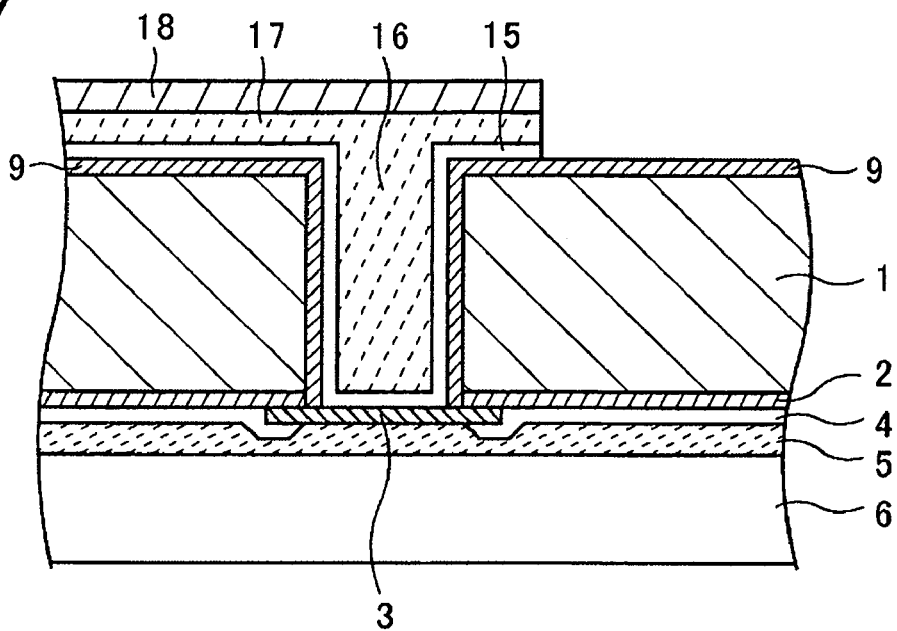

Then, as shown in FIG. 7, a resist layer 18 for forming a wiring pattern is selectively formed on the wiring layer 17 on the back surface of the semiconductor substrate 1. Then, an unnecessary part of the wiring layer 17 and the seed layer is removed by etching using the resist layer 18 as a mask. By this etching, the wiring layer 17 forms a predetermined wiring pattern. Then, the barrier layer 15 formed on the back surface of the semiconductor substrate 1 is selectively removed by etching using the wiring layer 17 as a mask.

The process of forming the barrier layer 15, the penetrating electrode 16, and the wiring layer 17 is not limited to the above process. For example, a resist layer or the like is formed on the back surface of the semiconductor substrate 1 except in a region where the barrier layer 15, the wiring layer 17 and so on are to be formed, and then these barrier layer 15, wiring layer 17 and so on are formed in a region not covered with this resist layer or the like, thereby completing the patterning of the layers. This process does not need the resist layer 18.

Figure 8:
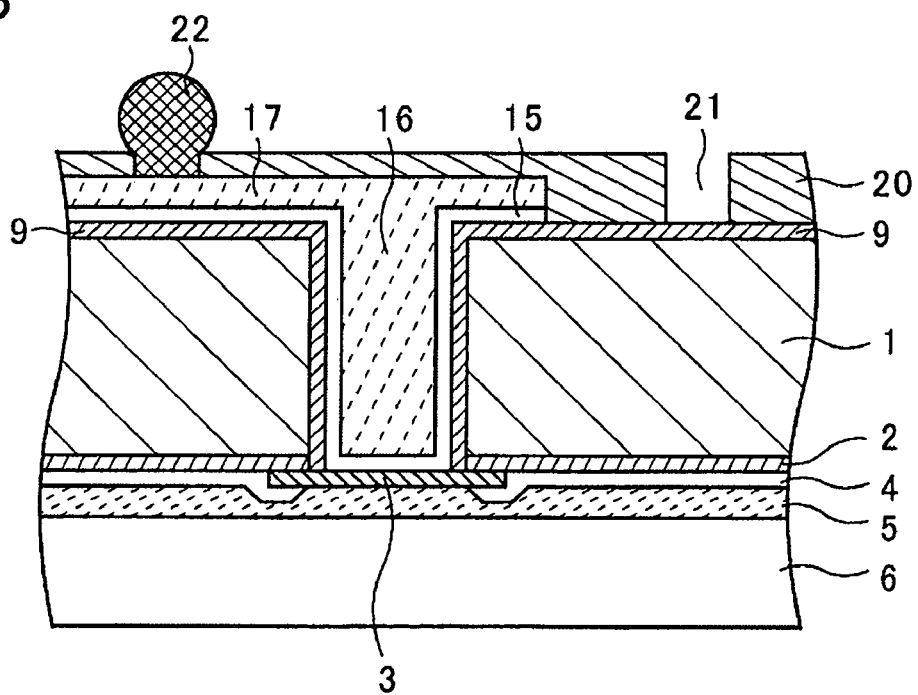

Then, as shown in FIG. 8, a protection layer 20 made of, for example, an organic material such as a solder resist or an inorganic material such as a silicon nitride film is selectively formed on the back surface of the semiconductor substrate 1 so as to have an opening 21 in a position corresponding to each of boundaries of individual semiconductor dies. Although the opening 21 may be formed in the other position, forming the opening 21 in a position corresponding to each of the boundaries of the individual semiconductor dies has a merit that the solvent supply path is formed and the semiconductor dies are separated at the same time. This opening 21 may not be formed at this time, and may be formed in an etching process using a resist layer 23 as a mask that will be described below. Furthermore, an opening is formed in the protection layer 20 in a conductive terminal formation region, an electrode connection layer (not shown) made of nickel and gold is formed on the wiring layer 17 exposed in the opening, and a ball-shaped conductive terminal 22 is formed thereon by screen-printing solder and reflowing the solder by heat treatment. The conductive terminal 22 may be formed by a dispensing method (a coating method) where solder, a ball shaped terminal or the like is coated with a dispenser, an electrolytic plating method, or the like.

Figure 9:
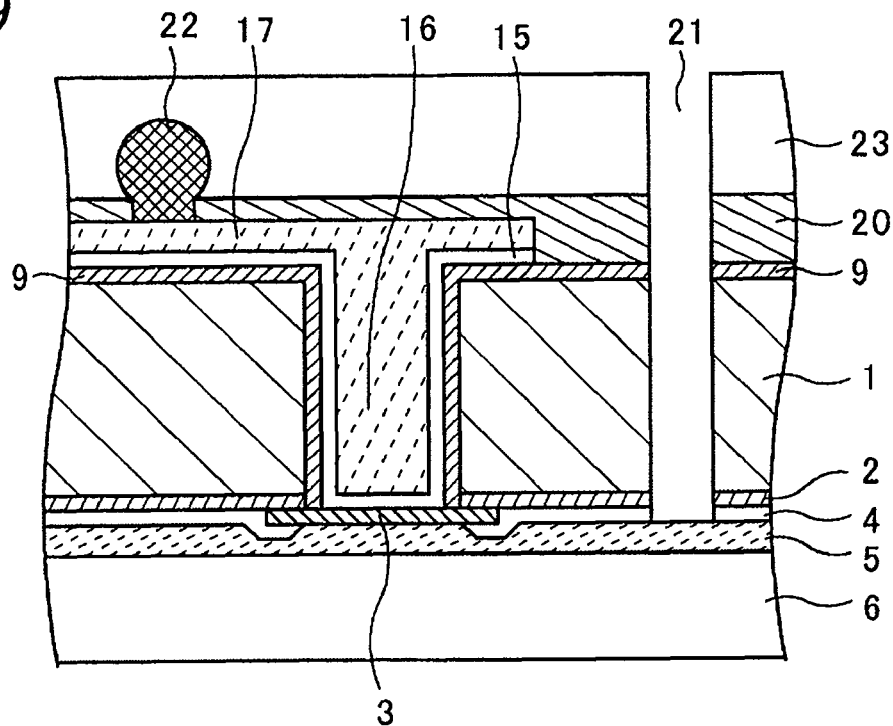

Then, as shown in FIG. 9, the semiconductor substrate 1 is partially removed to expose a portion of the adhesive layer 5. In detail, for example, the resist layer 23 is formed on the back surface of the semiconductor substrate 1, and the second insulation film 9, the semiconductor substrate 1, the first insulation film 2, and the passivation film 4 are removed by etching using this resist layer 23 as a mask in this order. Alternatively, these layers may be etched using the protection layer 20 provided with the opening 21 as a mask, instead of using the resist layer 23 as a mask. By this etching, a portion of the adhesive layer 5 is exposed in the opening 21.

Then, the resist layer 23 is removed. At this time, when the adhesive layer 5 is exposed, there may be a case where the adhesive layer 5 is also removed at the same time depending on the relation between the materials of the resist layer 23 and the adhesive layer 5. The following process may be used for preventing the adhesive layer 5 from being removed at the time when the resist layer 23 is removed. First, when the second insulation film 9 and the semiconductor substrate 1 are etched using the resist layer 23 as a mask, the passivation film 4 or the first insulation film 2 is left as it is without being etched. Then, the resist layer 23 is removed using the first insulation film 2 or the passivation film 4 as a stopper layer protecting the adhesive layer 5. Then, the first insulation film 2 and the passivation film 4 are removed by, for example, a wet etching method or the like to expose a portion of the adhesive layer 5.

In the case where the opening 21 is formed on each of the boundaries of the individual semiconductor dies, a number of semiconductor devices are separated in the individual semiconductor dies at the time when the adhesive layer 5 is partially exposed. This process does not need a dicing tape, a dicing blade, a laser, or the like that is necessary for a dicing process for separating the semiconductor devices in individual dies, thereby simplifying the manufacturing process and reducing the manufacturing cost.

Furthermore, mechanical stress is not applied to the sidewall (the section) of the opening in this embodiment, compared with the case of using a dicing blade, thereby providing advantages of formation of a smooth section without damage and prevention of cracking or chipping. This prevents a mechanical defect occurring during the dicing process, thereby realizing a semiconductor device having high reliability and increasing the yield thereof. Furthermore, there is no need to control pressure of a dicing blade, a cutting speed, or the like, thereby simplifying the manufacturing process.

A dicing blade or a laser may be used for separating the semiconductor devices in individual semiconductor dies although etching is more preferable. Separating the semiconductor devices in individual dies with a dicing blade or a laser has a merit that a photolithography for forming the resist layer 23 is not necessary.

Figure 10:
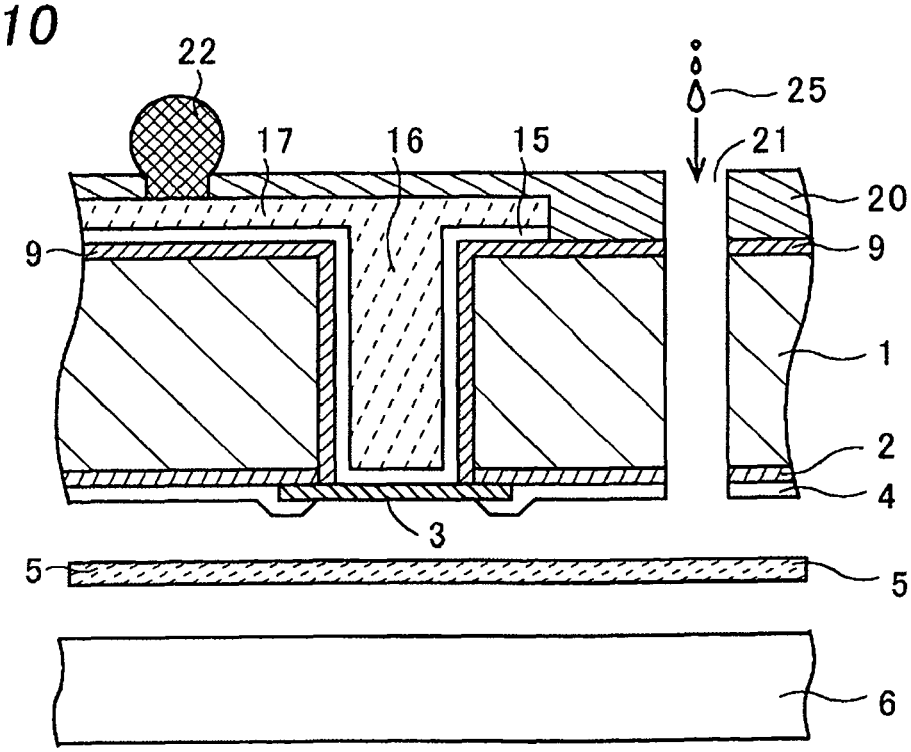

Then, as shown in FIG. 10, a solvent 25 (e.g. alcohol or acetone) is supplied to the exposed adhesive layer 5 through the opening 21 to gradually reduce its adhesion, and thereby the supporting body 6 is removed from the semiconductor substrate 1. The supporting body 6 may be collected and recycled.

This manner of removing the supporting body 6 by directly supplying the solvent 25 to the adhesive layer 5 reduces a load when the supporting body 6 is removed, thereby reducing a mechanical defect in the semiconductor device.

Figure 11:
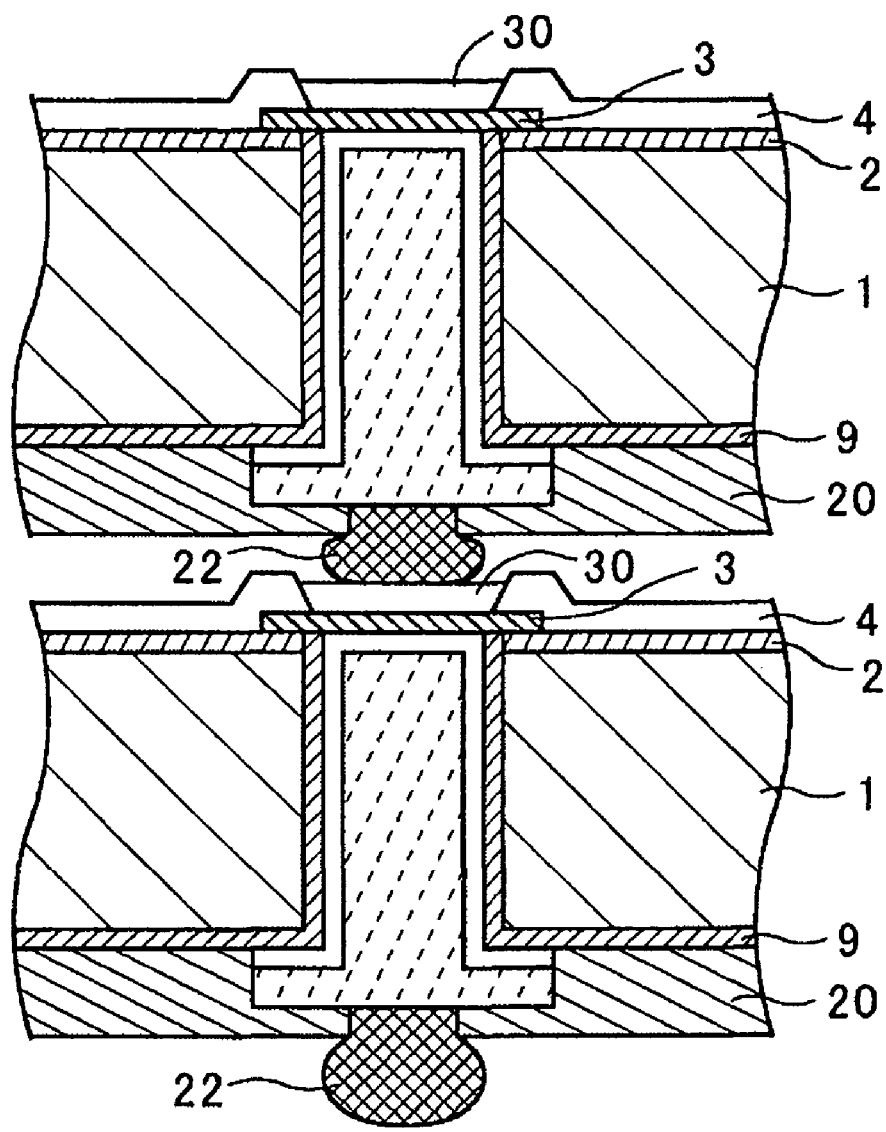

The chip size package type semiconductor device having the wiring from the pad electrode 3 formed on the front surface of the semiconductor substrate 1 to the conductive terminal 22 provided on the back surface thereof is thus completed by the above described process. When this semiconductor device is mounted on electronic equipment, the device is electrically connected to an external circuit by mounting the conductive terminal 22 on a wiring pattern on a circuit board When the semiconductor device completed by the above process is used for lamination with the other semiconductor device, an electrode connection layer 30 made of nickel (Ni) and gold (Au) or the like is formed on the pad electrode 3 with the element such as the electronic device formed on the back surface of the semiconductor substrate 1 being protected with a protection tape or the like. Then, as shown in FIG. 11, the pad electrode 3 of one semiconductor device and the conductive terminal 22 of the other semiconductor device are connected to each other with the electrode connection layer 30 interposed therebetween. The electrode connection layer 30 is necessary for a reason that the pad electrode 3 made of aluminum or the like and the conductive terminal 22 made of solder or the like are hardly attached to each other or for a reason that the layer 30 prevents a material of the conductive terminal 22 flowing toward the pad electrode 3 when the devices are laminated. It is noted that FIG. 11 shows a structure where the wiring layer 17 is not extended on the back surface of the semiconductor substrate 1.

Next, a second embodiment of the invention will be described referring to figures. In the method of manufacturing the semiconductor device of the first embodiment, when the completed semiconductor device is used for lamination, generally, the electrode connection layer 30 that is necessary for lamination is formed after the semiconductor device is completed, as described above. However, since the semiconductor substrate 1 is already thinned, there is a problem that a mechanical defect easily occurs when the device is moved by handling it or the like. Furthermore, since the electrode connection layer 30 is formed only on the pad electrode 3 on the front surface of the semiconductor substrate 1, the other part of the front surface needs to be protected when the electrode connection layer 30 is formed. Therefore, the manufacturing process becomes complex and the manufacturing cost increases.

In the second embodiment of the invention, a manufacturing process further suitable for manufacturing the semiconductor device for the lamination is employed in addition to the manufacturing process of the first embodiment. Description thereof will be given hereinafter. The same numerals are given to the same components as those of the first embodiment, and description thereof will be simplified or omitted.

Figure 12:
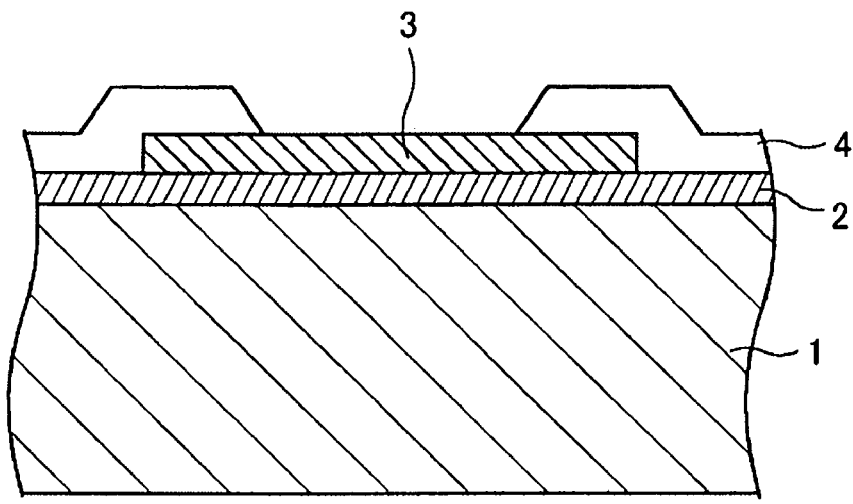
FIGS. 12 and 13 are cross-sectional views for explaining a method of manufacturing a semiconductor device of a second embodiment of the invention.

First, as shown in FIG. 12, the semiconductor substrate 1 formed with an electronic device (not shown) on its front surface is prepared. Then, the first insulation film 2 is formed on the front surface of the semiconductor substrate 1. Then, a metal layer made of aluminum (Al), copper (Cu), or the like is formed by a sputtering method, a plating method, or the other deposition method, and then the metal layer is etched using a resist layer (not shown) as a mask, thereby forming the pad electrode 3 on the first insulation film 2. The pad electrode 3 is electrically connected to the electronic device or the surrounding elements on the semiconductor substrate 1. Then, the passivation film 4 is formed on the front surface of the semiconductor substrate 1, covering a portion of the pad electrode 3. An insulation film made of an organic resin such as polyimide may be further formed as a protection film on the passivation film 4 in order to prevent corrosion or the like.

Figure 13:
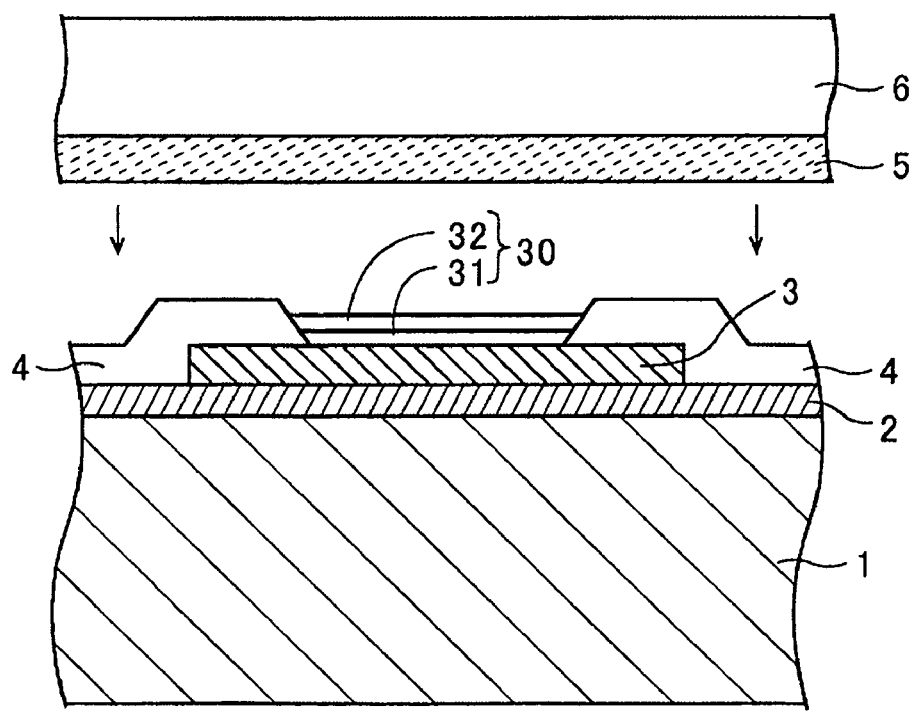

Then, as shown in FIG. 13, the electrode connection layer 30 is formed on the pad electrode 3. The electrode connection layer 30 is a lamination layer of a nickel (Ni) layer 31 and a gold (Au) layer 32 laminated in this order, for example, and formed by an lift-off method where these metals are sputtered in this order using a resist layer as a mask and then the resist layer is removed, or a plating method. The material of the electrode connection layer 30 may be changed according to needs depending on the material of the conductive terminal 22. In detail, the electrode connection layer 30 may be made of a titanium (Ti) layer, a copper (Cu) layer, a tin (Sn) layer, a nickel vanadium (NiV) layer, a tantalum (Ta) layer, a palladium (Pd) layer, or the like, instead of the nickel layer 31 and the gold layer 32. The material of the electrode connection layer 30 is not particularly limited and the layer 30 may be a single layer, a lamination layer of the above layers, or a layer made of an alloy of the above metals as long as it has a function of keeping electrical connection between the pad electrode 3 and the conductive terminal 22 and a function of protecting the pad electrode 3. A nickel layer/a gold layer, a titanium layer/a nickel layer/a copper layer, a titanium layer/a nickel layer/a gold layer, a titanium layer/a nickel vanadium layer/a copper layer, or the like are the examples of the lamination structure of the electrode connection layer 30.

Then, the supporting body 6 is attached on the front surface of the semiconductor substrate 1 with the adhesive layer 5 made of epoxy resin or the like interposed therebetween. Since subsequent processes are the same as the above described processes of the first embodiment, description thereof will be omitted.

The second embodiment of the invention mainly has the following effect in addition to the effect obtained in the first embodiment. Since the electrode connection layer 30 is formed before the supporting body 6 is attached and the semiconductor substrate 1 is thinned, the movement of the substrate by handling it or the like is easy in the process of forming the electrode connection layer 30 and thus a mechanical defect is prevented.

Furthermore, since the electrode connection layer 30 is formed before the wiring layer 17, the conductive terminal 22 and so on are formed on the back surface of the semiconductor substrate 1, the special protection of the back surface of the semiconductor substrate 1 is not needed, thereby simplifying the manufacturing process. Furthermore, since the lamination structure is formed at the time when the semiconductor device is completed, the workability and efficiency are enhanced. Furthermore, when the penetrating electrode 16 is formed, the electrode connection layer 30 functions as a member reinforcing the pad electrode 3 from the front surface side of the semiconductor substrate 1. This has an advantage of preventing problems such as missing, breaking, warping, or the like of the pad electrode 3 when the penetrating electrode 16 is formed.

Next, a third embodiment of the invention will be described referring to figures. The same numerals are given to the same components in the structure and the manufacturing process as those of the first or second embodiment, and description thereof will be simplified or omitted.

Figure 17:
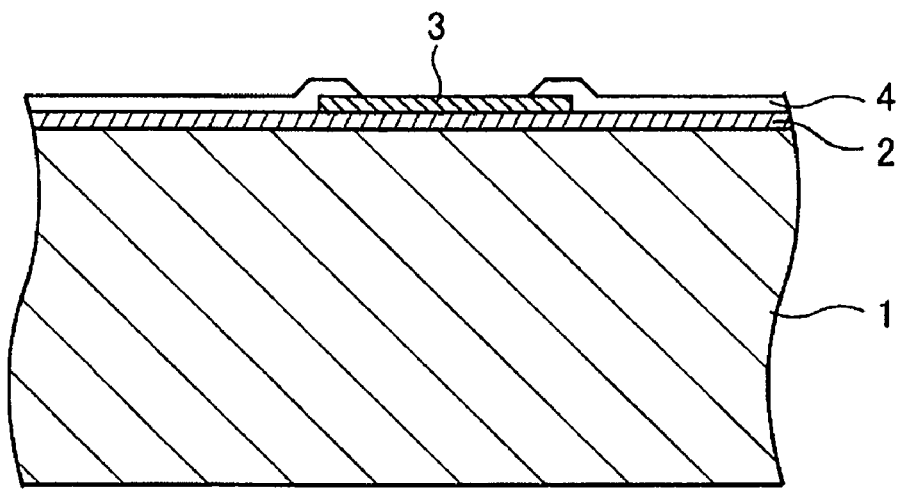

First, as shown in FIG. 17, the semiconductor substrate 1 formed with an electronic device (not shown) on its front surface is prepared. Then, the first insulation film 2, the pad electrode 3, and the passivation film 4 are formed on the front surface of the semiconductor substrate 1 in this order.

Figure 18A:
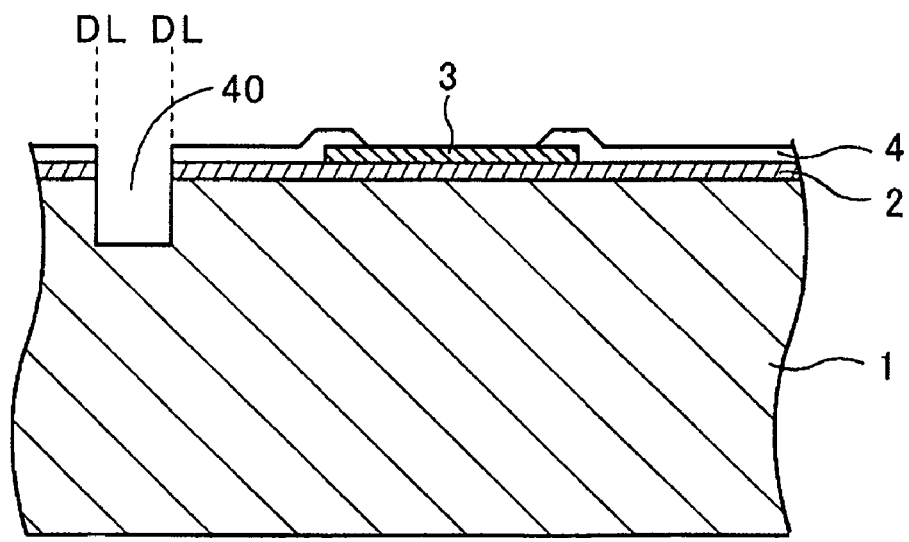

Then, as shown in FIG. 18A, a portion of the front surface of the semiconductor substrate 1 is removed to form a groove 40. The groove 40 is to form a part of a solvent supply path that will be described below, and its depth is preferably about 10 μm or more.

The groove 40 is preferably provided along the dicing line DL as shown in FIG. 18A. By forming the groove 40 along the dicing line DL, the process of forming the solvent supply path and the process of separating the semiconductor dies (the so-called dicing process) are performed at the same time as described below. FIGS. 19A and 19B are plan views of the semiconductor substrate 1 formed with the groove 40.

The groove 40 is formed by the so-called half-etching. In detail, for example, the groove 40 as shown in FIG. 18A is formed by removing a portion of the semiconductor substrate 1 by etching using a resist layer (not shown) as a mask.

Figure 18B:
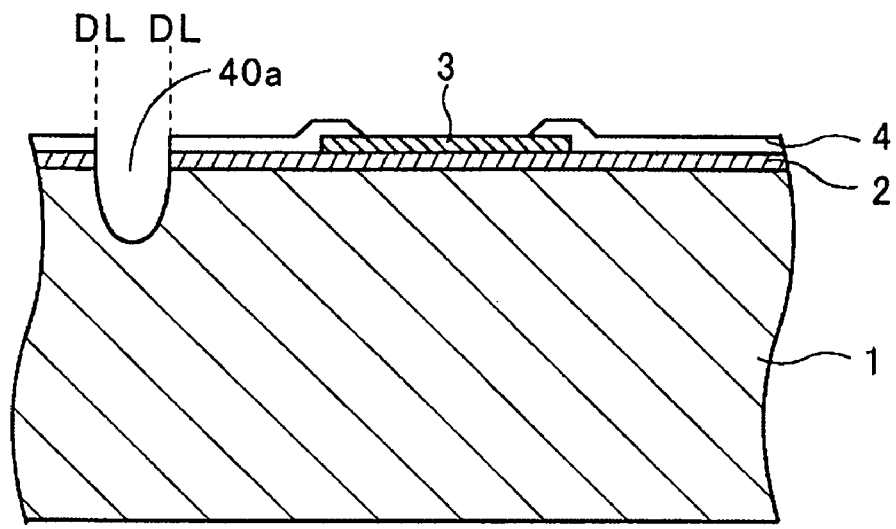
Figure 18C:
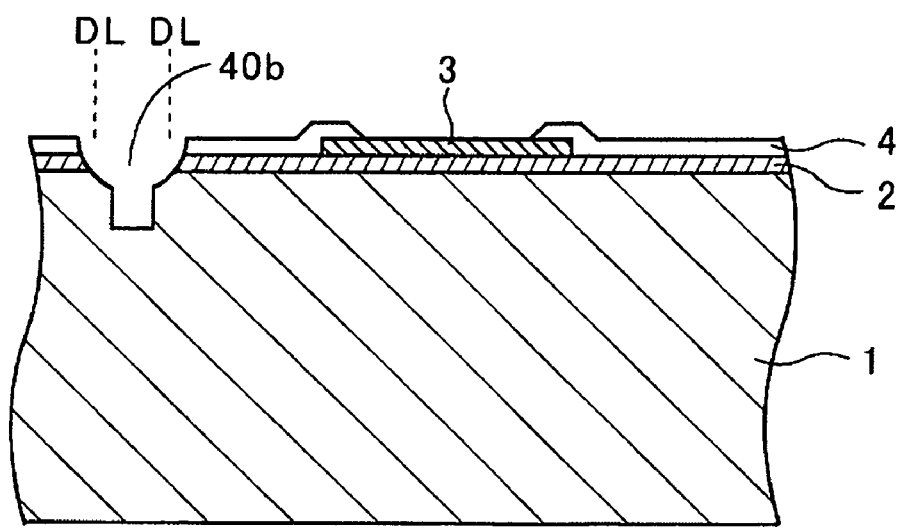

Alternatively, a groove 40a as shown in FIG. 18B may be formed by mechanically removing a portion of the semiconductor substrate 1 with a dicing blade. With the dicing blade, the cross-section of the groove 40a forms the shape of the blade as shown in FIG. 18B (the width on the front surface side of the semiconductor substrate 1 is slightly larger than on the other side). The formation of such a groove of which the width is larger on the front surface side of the semiconductor substrate 1 is preferable for smoothly supplying the solvent when the supporting body is removed. Alternatively, the cross-section of the groove may form such a shape that the width increases toward the front surface side of the semiconductor substrate 1 and a convex is formed on the back surface side (a groove 40b) as shown in FIG. 18C by combining isotropic etching and anisotropic etching for forming the groove.

As shown in FIG. 19A, however, when the groove 40 is exposed from the periphery of the semiconductor substrate 1, there may be a case where a corrosive substance (e.g. chemicals in the wet process) enters the semiconductor substrate 1 from outside (from the surroundings of the semiconductor substrate 1 or the like) through the grooves 40 to provide undesired influence on the substrate 1 after the supporting body is attached. Therefore, it is preferable to form the groove 40 in the semiconductor substrate 1 except on its periphery 41 of a predetermined width (e.g. about 3 mm), that is, so as to avoid exposing the groove 40 to the outside when the supporting body 6 is attached on the substrate, as shown in FIG. 19B. In detail, for example, a resist layer is formed so as to avoid the remove of the periphery 41, and the substrate 1 is etched using this resist layer as a mask to form the desired groove 40 except on the periphery 41. By this manufacturing process, since the periphery 41 of the semiconductor substrate 1 functions as a protection barrier even after the supporting body 6 is attached on the substrate 1, the front surface of the semiconductor substrate 1 is protected against infiltration of a corrosive substance.

Then, as shown in FIG. 20, the supporting body 6 is attached on the front surface of the semiconductor substrate 1 with the adhesive layer 5 interposed therebetween. Then, back-grinding is performed to the back surface of the semiconductor substrate 1 with a back surface grinder to thin the semiconductor substrate 1 to a predetermined thickness. Then, the resist layer 7 is selectively formed on the back surface of the semiconductor substrate 1. Then, the semiconductor substrate 1 is etched using the resist layer 7 as a mask to form the via hole 8.

Figure 21:
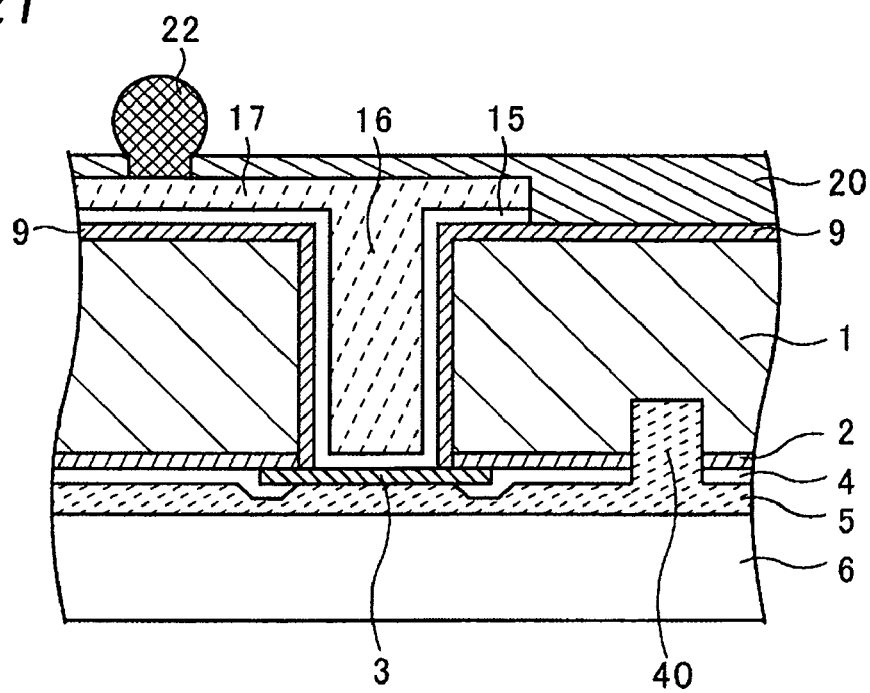

Then, as shown in FIG. 21, the second insulation film 9, the barrier layer 15, the seed layer, the penetrating electrode 16, the wiring layer 17, the protection layer 20, and the conductive terminal 22 are formed. The process of forming these is the same as that of the first embodiment.

Figure 22:
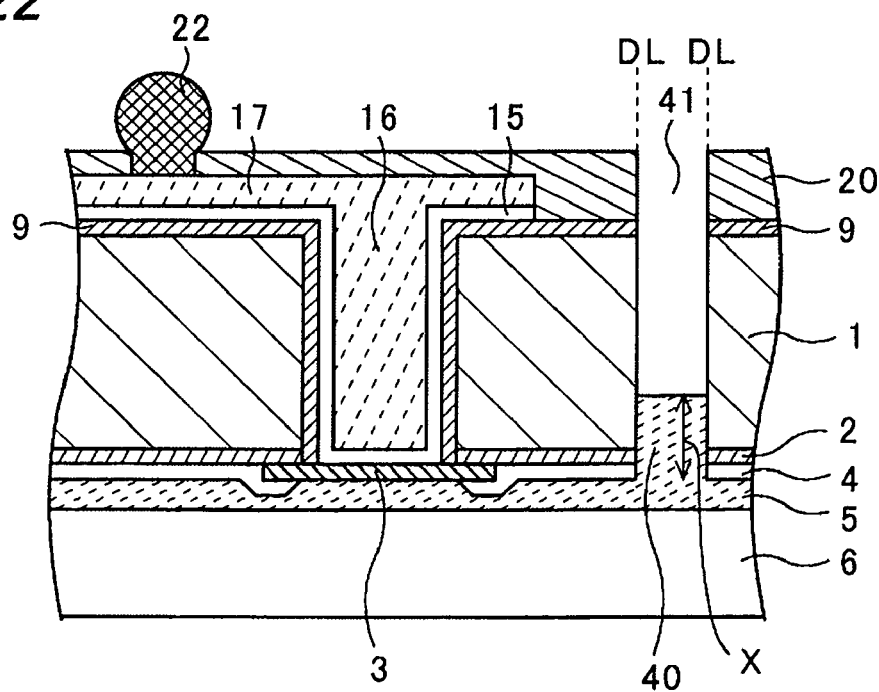

Then, as shown in FIG. 22, a portion of the semiconductor substrate 1 is removed along the predetermined dicing line DL to form an opening 41 (the solvent supply path) exposing a portion of the adhesive layer 5. The opening 41 is connected to the groove 40 at its bottom. In detail, the protection layer 20, the second insulation film 9, and the semiconductor substrate 1 are removed in this order with a dicing blade, for example, until the opening reaches the groove 40. In this embodiment, since it is not necessary to insert the dicing blade deep into the semiconductor substrate 1 by an amount of a height X of the groove 40 in a vertical direction, there is significantly reduced possibility that the dicing blade contacts and damages the supporting body 6 when the opening 41 is formed.

The method of forming the opening 41 is not limited to this. For example, a resist layer (not shown) may be formed on the back surface of the semiconductor substrate 1, and the opening 41 may be formed by removing the protection layer 20, the second insulation film 9, and the semiconductor substrate 1 by etching using the resist layer as a mask in this order. Alternatively, the opening 41 may be formed by providing an opening in the protection layer 20 in a position corresponding to the groove 40 and performing etching using the protection layer 20 as a mask. Alternatively, the opening 41 may be formed with a laser.

When the opening 41 is formed by etching, there is an advantage that the cut surface is formed smooth and cracking or chipping is prevented since the sidewall (the section) of the opening does not suffer mechanical stress and much damage, compared with the formation with a dicing blade.

Although it is possible to separate the semiconductor dies by dicing in the different process after the opening 41 is formed to expose a portion of the adhesive layer 5, it is preferable to perform these processes at the same time. That is, the formation of the groove 40 and the opening 41 along the dicing line DL enables simultaneous performance of these processes, thereby simplifying the manufacturing process and reducing the manufacturing cost.

Figure 23:
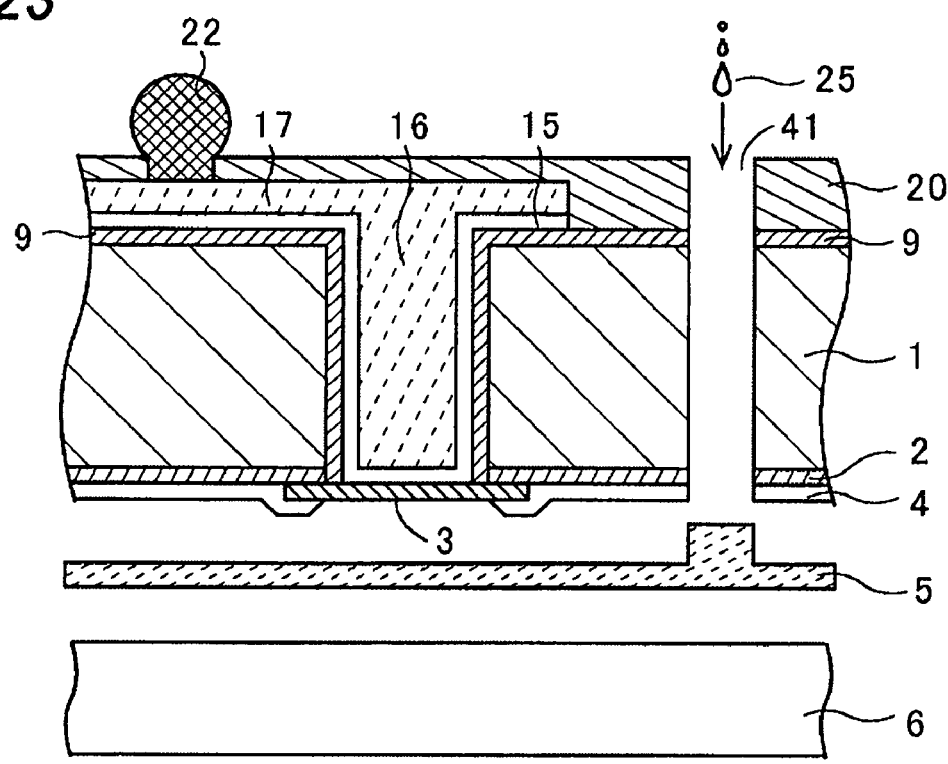

Then, as shown in FIG. 23, the solvent 25 is supplied to the exposed adhesive layer 5 through the opening 41 to gradually reduce its adhesion, and thereby the supporting body 6 is removed from the semiconductor substrate 1. In this embodiment, since the supporting body 6 is not damaged during the formation of the opening 41 as described above, the supporting body 6 is collected and effectively recycled.

Furthermore, by directly supplying the solvent 25 to the adhesive layer 5 in this manner to remove the supporting body 6, a load when the supporting body 6 is removed is reduced, thereby reducing a mechanical defect in the semiconductor device.

By the above processes, the chip size package type semiconductor device having a wiring from the pad electrode 3 formed on the front surface of the semiconductor substrate 1 to the conductive terminal 22 on the back surface thereof is completed.

In the third embodiment, since it is not necessary to use a supporting body formed with a solvent supply path such as a penetrating hole or a groove, like in the above described embodiments, the manufacturing process is simplified and the cost is reduced. Furthermore, this prevents the influence of the solvent supply path such as outgassing or infiltration of a corrosive substance.

Furthermore, the supporting body is not damaged even when the semiconductor dies are separated with a dicing blade. This facilitates the recycle of the supporting body and reduces the manufacturing cost.

Figure 24:
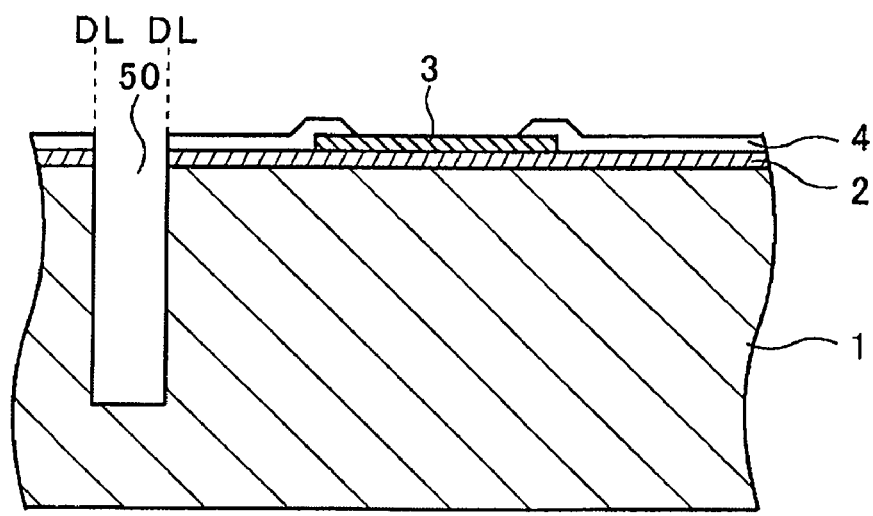

Alternatively, the semiconductor device may be manufactured by removing the supporting body as described below. As shown in FIG. 24, a portion of the front surface of the semiconductor substrate 1 is removed, and half-etched along the dicing line DL to provide a groove 50. The depth of the groove 50 equals the desired thickness of the semiconductor substrate 1, i.e., the thickness of the semiconductor substrate 1 after back-ground, for example, about 50 μm.

Figure 25:
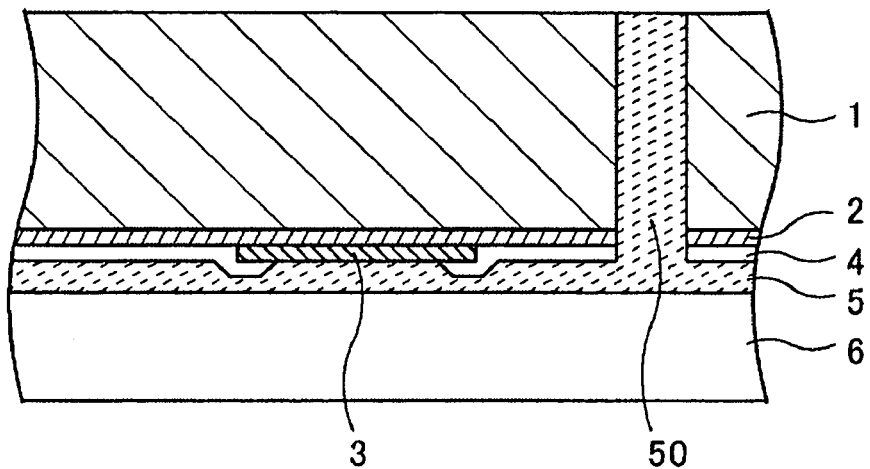

Then, as shown in FIG. 25, the supporting body 6 is attached on the front surface of the semiconductor substrate 1 with the adhesive layer 5 interposed therebetween. Then, back-grinding is performed to the back surface of the semiconductor substrate 1 with a back surface grinder to thin the semiconductor substrate 1 to a predetermined thickness (e.g. about 50 μm). The adhesive layer 5 is exposed from the groove 50 by this back-grinding. Subsequent processes are almost the same as those described above, where the via hole, the wiring layer and so on are formed, the adhesive layer 5 in the groove 50 is exposed, the solvent is supplied from the portion exposing the layer 5, the supporting body 6 is removed, and thereby individual semiconductor devices are completed.

The feature of this process is that the thickness of the groove 50 equals the thickness of the substrate after background, and a portion of the adhesive layer 5 is simultaneously exposed by the back-grinding. In this process, the remove of the semiconductor substrate 1 for securing the solvent supply path is simultaneously performed by the back-grinding, the subsequent process of removing a portion of the semiconductor substrate 1 with a dicing blade or etching is not necessary, and the supporting body 6 is not damaged. Furthermore, it is also possible to perform the process of exposing the adhesive layer 5 and the process of separating the semiconductor dies at the same time, thereby streamlining the manufacturing process.

When the semiconductor device manufactured in the third embodiment is used for lamination with the other semiconductor device, the process shown in the second embodiment may be added (the process of forming the electrode connect layer 30).

Although the above described embodiments are described for the BGA (ball grid array) type semiconductor device having the ball-shaped conductive terminal, the invention is also applied to an LGA (land grid array) type, a CSP, and a flip chip type semiconductor devices having no ball-shaped conductive terminal.

Furthermore, although the above described embodiments are described for the so-called penetrating electrode type semiconductor device, modifications of the invention are possible within the scope of the invention without limitation to the above embodiments.

Figure 26:
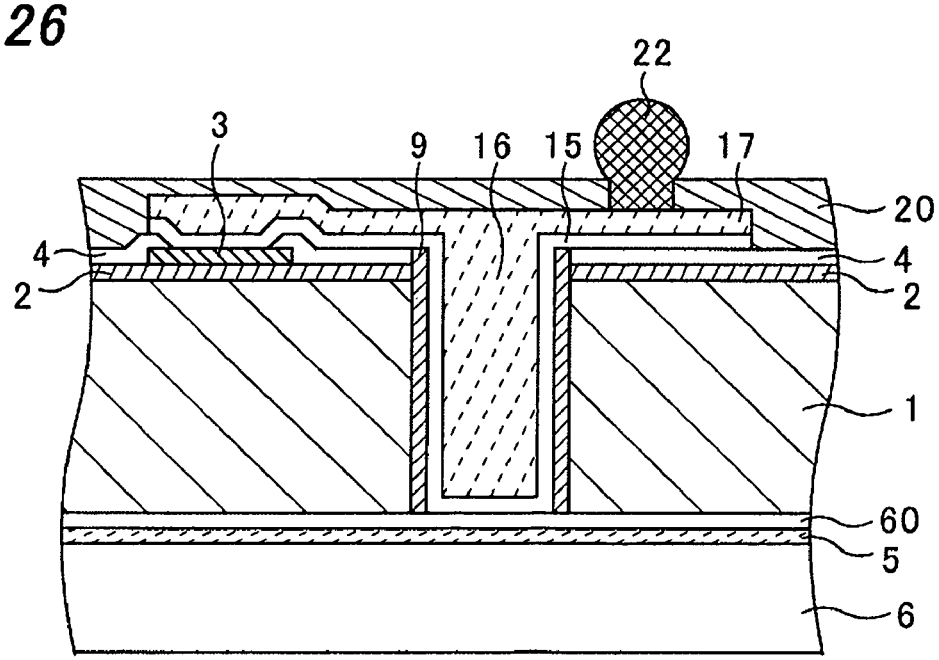
FIG. 26 is a cross-sectional view for explaining an example of modifications of the semiconductor device of the embodiments of the invention.

For example, while the supporting body 6 is attached on the front surface side (the side formed with the element) of the semiconductor substrate 1 in the above described embodiments, it is possible to form the semiconductor device with the supporting body 6 being attached on the other side (the surface not formed with the element) as shown in FIG. 26. In this case, an opening (not shown) exposing a portion of the adhesive layer 5 is formed from the front surface side of the semiconductor substrate 1 by the same process as in the above described embodiments. Then, a solvent is supplied in the opening to gradually reduce the adhesion of the adhesive layer 5, and thereby the supporting body 6 is removed from the semiconductor substrate 1. This semiconductor device has the pad electrode 3, the wiring layer 17, the conductive terminal 22 and so on on the front surface side (the surface formed with the element) of the semiconductor substrate 1. When this semiconductor device is mounted on electronic equipment, the device is electrically connected to an external circuit by mounting the conductive terminal 22 on a wiring pattern on a circuit board.

Furthermore, the following process may be employed after the supporting body 6 of the semiconductor device shown in FIG. 26 is removed. The insulation film 60 formed on the back surface of the semiconductor substrate 1 in a position corresponding to the penetrating electrode 16 (e.g. a silicon oxide film formed by a CVD method) is selectively removed to form an opening there. Then, an electrode connection layer (e.g. a lamination layer of a nickel layer and a gold layer) is formed on the barrier layer 15 in the opening by, for example, a sputtering method. Then, the penetrating electrode 16 and the electrode of the other semiconductor device are connected through the electrode connection layer, thereby completing the lamination of the semiconductor devices.

Alternatively, after the insulation film 60 is selectively removed, the barrier layer 15 in the opening is removed to expose the penetrating electrode 16 from the back surface side of the semiconductor substrate 1. Then, an electrode connection layer (not shown) (e.g. a lamination layer of a nickel layer and a gold layer) is formed on the exposed surface of the penetrating electrode 16 by, for example, a plating method, and the penetrating electrode 16 and the electrode of the other semiconductor device are connected through the electrode connection layer, thereby completing the lamination of the semiconductor devices.

In FIG. 26, the same numerals are given to the same components as those described above, and description thereof is omitted. In this manner, the supporting body 6 is attached on any surface of the semiconductor substrate. The invention is broadly applied to the method of manufacturing the semiconductor device with the supporting body.

The embodiments of the invention do not require the supporting body formed with the solvent supply path such as a penetrating hole or a groove. Therefore, the manufacturing process is simplified, the manufacturing cost is reduced, and bad influences such as outgassing or infiltration of a corrosive substance due to the solvent supply path is prevented.

Furthermore, forming the electrode connection layer on the pad electrode for connection to the electrode of the other semiconductor device before the supporting body is attached enables the manufacturing of a high-performance semiconductor device for lamination having high reliability and increases the yield thereof. Furthermore, the lamination of the semiconductor die is performed after the individual semiconductor dies are separated, thereby enhancing the workability.

What is claimed is:

1. A method of manufacturing a semiconductor device, comprising:
   forming a groove in a semiconductor substrate from a front surface thereof;
   attaching a supporting body to the front surface of the semiconductor substrate having the groove formed therein using an adhesive layer disposed between the supporting body and the front surface of the semiconductor substrate, the adhesive layer filling the groove in the semiconductor substrate at least partially;
   forming an opening in the semiconductor substrate from a back surface thereof so that the opening is connected with the groove to expose a portion of the adhesive layer; and
   separating the supporting body from the semiconductor substrate by supplying a solvent to the exposed portion of the adhesive layer so as to dissolve the adhesive layer.

2. The method of claim 1, wherein the formation of an opening in the semiconductor is performed using a dicing blade, a laser or etching.

3. The method of claim 1, further comprising grinding the back surface of the semiconductor substrate after the attaching of the supporting body.

4. The method of claim 1, wherein the groove is formed along a dicing line of the semiconductor substrate.

5. The method of claim 1, wherein the groove is not formed in a periphery portion of the semiconductor substrate.

6. A method of manufacturing a semiconductor device, comprising:
- forming a groove in a semiconductor substrate from a front surface thereof;
- forming an insulation film on the front surface of the semiconductor substrate and a pad electrode on the insulation film;
- attaching a supporting body to the front surface of the semiconductor substrate having the groove, the insulation film and the pad electrode using an adhesive layer disposed between the supporting body and the front surface of the semiconductor substrate;
- after the attaching of the supporting body, exposing the pad electrode by removing a portion of the semiconductor substrate and a portion of the insulation film from the back surface of the semiconductor substrate;
- forming a wiring layer electrically connected with the exposed pad electrode;
- forming a protection film on the back surface of the semiconductor substrate to cover the wiring layer;
- forming an opening in the semiconductor substrate from a back surface thereof so that the opening is connected with the groove to expose a portion of the adhesive layer; and
- separating the supporting body from the semiconductor substrate by supplying a solvent to the exposed portion of the adhesive layer so as to dissolve the adhesive layer.

7. The method of claim 6, further comprising forming an electrode connection layer on the pad electrode prior to the attaching of the supporting body, the electrode connection layer being configured for electrical connection with an electrode of an external semiconductor device.

8. The method of claim 7, wherein the electrode connection layer comprises nickel, gold, copper, tin or a combination thereof.

9. The method of claim 1, further comprising, after the attaching of the supporting body, forming a via hole in the semiconductor substrate from the back surface of the semiconductor substrate, forming a wiring layer in the via hole so as to extend over the back surface of the semiconductor substrate, and forming a protection film on the back surface of the semiconductor substrate to cover the wiring layer.

10. The method of claim 1, wherein the supporting body has no path for supplying the solvent.

11. The method of claim 1, wherein the supporting body comprises a rigid substrate.

12. A method of manufacturing a semiconductor device, comprising:
- forming a groove in a semiconductor substrate from a front surface thereof;
- attaching a supporting body to the front surface of the semiconductor substrate having the groove formed therein using an adhesive layer disposed between the supporting body and the front surface of the semiconductor substrate, the adhesive layer filling the groove in the semiconductor substrate at least partially so as to be in direct contact with a sidewall of the groove;
- thinning the semiconductor substrate by grinding a back surface of the semiconductor substrate so as to expose a portion of the adhesive layer; and
- separating the supporting body from the semiconductor substrate by supplying a solvent to the exposed portion of the adhesive layer so as to dissolve the adhesive layer.

13. The method of claim 12, wherein the groove is formed along a dicing line of the semiconductor substrate.

14. The method of claim 12, wherein the groove is not formed in a periphery portion of the semiconductor substrate.

15. The method of claim 12, further comprising, prior to the attaching of the supporting body, forming an insulation film on the front surface of the semiconductor substrate and a pad electrode on the insulation film, and further comprising, after the attaching of the supporting body, exposing the pad electrode by removing a portion of the semiconductor substrate and a portion of the insulation film from the back surface of the semiconductor substrate, forming a wiring layer electrically connected with the exposed pad electrode, and forming a protection film on the back surface of the semiconductor substrate to cover the wiring layer.

16. The method of claim 15, further comprising forming an electrode connection layer on the pad electrode prior to the attaching of the supporting body, the electrode connection layer being configured for electrical connection with an electrode of an external semiconductor device.

17. The method of claim 16, wherein the electrode connection layer comprises nickel, gold, copper, tin or a combination thereof.

18. The method of claim 12, further comprising, after the attaching of the supporting body, forming a via hole in the semiconductor substrate from the back surface of the semiconductor substrate, forming a wiring layer in the via hole so as to extend over the back surface of the semiconductor substrate, and forming a protection film on the back surface of the semiconductor substrate to cover the wiring layer.

19. The method of claim 12, wherein the supporting body comprises a rigid substrate.

\* \* \* \* \*